(12) United States Patent
Karino

(10) Patent No.: US 11,626,221 B2
(45) Date of Patent: Apr. 11, 2023

(54) RESISTANCE ELEMENT AND ITS MANUFACTURING METHOD

(71) Applicant: Fuji Electric Co., Ltd., Kanagawa (JP)

(72) Inventor: Taichi Karino, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/734,979

(22) Filed: May 2, 2022

(65) Prior Publication Data

US 2022/0406494 A1 Dec. 22, 2022

(30) Foreign Application Priority Data

Jun. 16, 2021 (JP) .............................. JP2021-100332

(51) Int. Cl.
*H01C 17/00* (2006.01)
*H01C 1/142* (2006.01)
*H01L 23/522* (2006.01)
*H01L 23/00* (2006.01)

(52) U.S. Cl.
CPC ........... *H01C 17/006* (2013.01); *H01C 1/142* (2013.01); *H01L 23/5226* (2013.01); *H01L 23/5228* (2013.01); *H01L 24/05* (2013.01); *H01L 2224/04042* (2013.01); *H01L 2224/05093* (2013.01)

(58) Field of Classification Search
CPC ... H01C 17/006; H01C 1/142; H01L 23/5228; H01L 2224/04042
See application file for complete search history.

(56) References Cited

U.S. PATENT DOCUMENTS

| 4,208,781 A * | 6/1980 | Rao .................... H01L 21/76838 257/E21.582 |
| 8,987,777 B2 * | 3/2015 | Hauenstein ........... H01L 25/071 257/140 |
| 9,219,077 B2 * | 12/2015 | Yokoyama .......... H01L 29/4966 |
| 2006/0145296 A1 * | 7/2006 | Coolbaugh ............. H01L 28/20 257/E27.047 |

(Continued)

FOREIGN PATENT DOCUMENTS

| JP | 3973491 B2 | 9/2007 |
| JP | 6371122 B2 | 8/2018 |

(Continued)

*Primary Examiner* — Kyung S Lee
(74) *Attorney, Agent, or Firm* — Chen Yoshimura LLP

(57) ABSTRACT

A resistance element includes a plurality of resistance chips stacked vertically, each of the plurality of resistance chips including a semiconductor substrate, one or more resistance layers on a field insulating film, a pad forming electrode on electrically connected to the one or more resistance layers, a relay wiring on the interlayer insulating film, laterally separated from the pad forming electrode, electrically connected to another end of at least one of the one or more resistance layers on one end and to a semiconductor substrate on another end, and a back surface electrode at a bottom of the semiconductor substrate, making ohmic contact with the semiconductor substrate, wherein the plurality of resistance chips have the same planar outer shape, and are stacked one over another so as to constitute a resistor as a whole.

11 Claims, 29 Drawing Sheets

(56) References Cited

U.S. PATENT DOCUMENTS

| | | | |
|---|---|---|---|
| 2007/0103846 A1* | 5/2007 | Eggerding | H01G 4/35 361/306.3 |
| 2011/0220403 A1* | 9/2011 | Lin | H05K 3/403 174/261 |
| 2019/0006527 A1 | 1/2019 | Toyoda et al. | |
| 2019/0181089 A1 | 6/2019 | Karino et al. | |
| 2019/0259758 A1 | 8/2019 | Iwamizu | |

FOREIGN PATENT DOCUMENTS

| | | |
|---|---|---|
| JP | 2019-12800 A | 1/2019 |
| JP | 2019-106485 A | 6/2019 |
| JP | 2019-145547 A | 8/2019 |

* cited by examiner

RESISTANCE ELEMENT AND ITS MANUFACTURING METHOD

BACKGROUND OF THE INVENTION

Technical Field

The present invention relates to a resistance element used for a gate resistance element or the like of a switching element and a method for manufacturing the same.

Background Art

As a resistance element for a semiconductor device such as a semiconductor integrated circuit (IC), a resistance element having an insulating layer provided on a silicon substrate and a thin film resistance layer provided on the insulating layer is known. In this resistance element, two electrodes connected to the side surfaces of the resistance layers facing each other are present on the upper surface side of the resistance layer. Therefore, as the chip size increases, two bonding wires connected to the two electrodes are required.

Therefore, Patent Document 1 discloses a vertical resistance element whose resistor is an electrical path between the pad forming electrode on the upper surface side and the back surface electrode on the lower surface side. According to the resistance element described in Patent Document 1, since the pad area on the upper surface side is one, the number of bonding wires can be reduced to one, and the occupied area of the pad area on the upper surface side can be reduced, thereby reducing the chip size.

Patent Document 2 discloses a stacked integrated circuit including a lower chip including a lower semiconductor element and an upper chip including an upper semiconductor element. Patent Document 3 discloses a semiconductor module in which a semiconductor substrate, which is an IC chip on which a protective element is formed, is stacked on a semiconductor substrate, which is a driver IC chip. Patent Document 4 discloses a power semiconductor device in which a power IC chip and an integrated circuit chip having a chip size larger than that of the power IC chip are arranged so that their main surfaces face each other. Patent Document 5 discloses a semiconductor device in which a semiconductor chip on which a power FET is formed and a semiconductor chip on which a comparator is formed are connected via bumps.

RELATED ART DOCUMENT

Patent Document

Patent Document 1: Japanese Patent Application Laid-Open Publication No. 2019-106485
Patent Document 2: Japanese Patent Application Laid-Open Publication No. 2019-145547
Patent Document 3: Japanese Patent Application Laid-Open Publication No. 2019-12800
Patent Document 4: Japanese Patent No. 6371122
Patent Document 5: Japanese Patent No. 3973491

SUMMARY OF THE INVENTION

The resistance element described in Patent Document 1 constitutes one vertical resistor with one chip. Therefore, it is necessary to design a resistance element having an appropriate resistance value for each semiconductor module, and the number of models increases. Further, when the chip size of the resistance element is changed, it is necessary to change the mounting area in the semiconductor module. Further, if the width of the resistor is narrowed in a single chip in order to make the resistance of the resistance element high, it becomes difficult to achieve sufficient the electrostatic discharge (ESD) withstand capacity.

In view of the forgoing, it is an object of the present invention to provide a resistance element capable of increasing resistance while ensuring sufficient ESD withstand capacity without changing the mounting area, and a method for manufacturing the same.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a resistance element, comprising: a plurality of resistance chips stacked vertically, each of the plurality of resistance chips including: a semiconductor substrate, a field insulating film on the semiconductor substrate, one or more resistance layers on the field insulating film, an interlayer insulating film covering the field insulating film and the one or more resistance layers, a pad forming electrode on the interlayer insulating film and electrically connected to one end of at least one of the one or more resistance layers, a relay wiring on the interlayer insulating film, laterally separated from the pad forming electrode, one end of the relay wiring being electrically connected to one end of at least one of the one or more resistance layers other than said one end of at least one of the one or more resistance layers to which the pad forming electrode is electrically connected, another end of the relay wiring making ohmic contact with the semiconductor substrate, and a back surface electrode at a bottom of the semiconductor substrate, making ohmic contact with the semiconductor substrate, wherein the plurality of resistance chips have the same planar outer shape, and are stacked one over another such that the back surface electrode of the resistance chip stacked on top of another resistance chip is electrically connected to the pad forming electrode of the another resistance chip immediately therebelow so that a current path between the pad forming electrode on an uppermost resistance chip and the back surface electrode of a lowermost resistance chip constitutes a resistor.

In another aspect, the present disclosure provides a method for manufacturing a resistance element, comprising: preparing a plurality of resistance chips, each of the plurality of resistance chips having the same planar outer shape and including: a semiconductor substrate, a field insulating film on the semiconductor substrate, one or more resistance layers on the field insulating film, an interlayer insulating film covering the field insulating film and the one or more resistance layers, a pad forming electrode on the interlayer insulating film and electrically connected to one end of at least one of the one or more resistance layers, a relay wiring on the interlayer insulating film, laterally separated from the pad forming electrode, one end of the relay wiring being electrically connected to one end of at least one of the one or more resistance layers other than said one end of at least one of the one or more resistance layers to which the pad forming electrode is electrically connected, another end of the relay wiring making ohmic contact with the semiconductor substrate, and a back surface electrode at a bottom of the semiconductor substrate, making ohmic contact with the semiconductor substrate; and stacking the plurality of resistance elements vertically such that the back surface electrode of the resistance chip stacked on top of another resistance chip is electrically connected to the pad forming electrode of the another resistance chip immediately therebelow so that a current path between the pad forming electrode on an uppermost resistance chip and the back surface electrode of a lowermost resistance chip constitutes a resistor.

According to one or more aspects of the present invention, it is possible to provide a resistance element capable of increasing resistance while ensuring the ESD withstand capability without changing the mounting area, and a method for manufacturing the same.

It is to be understood that both the foregoing general description and the following detailed description are exemplary and explanatory, and are intended to provide further explanation of the invention as claimed.

DETAILED DESCRIPTION OF EMBODIMENTS

Figure 1:
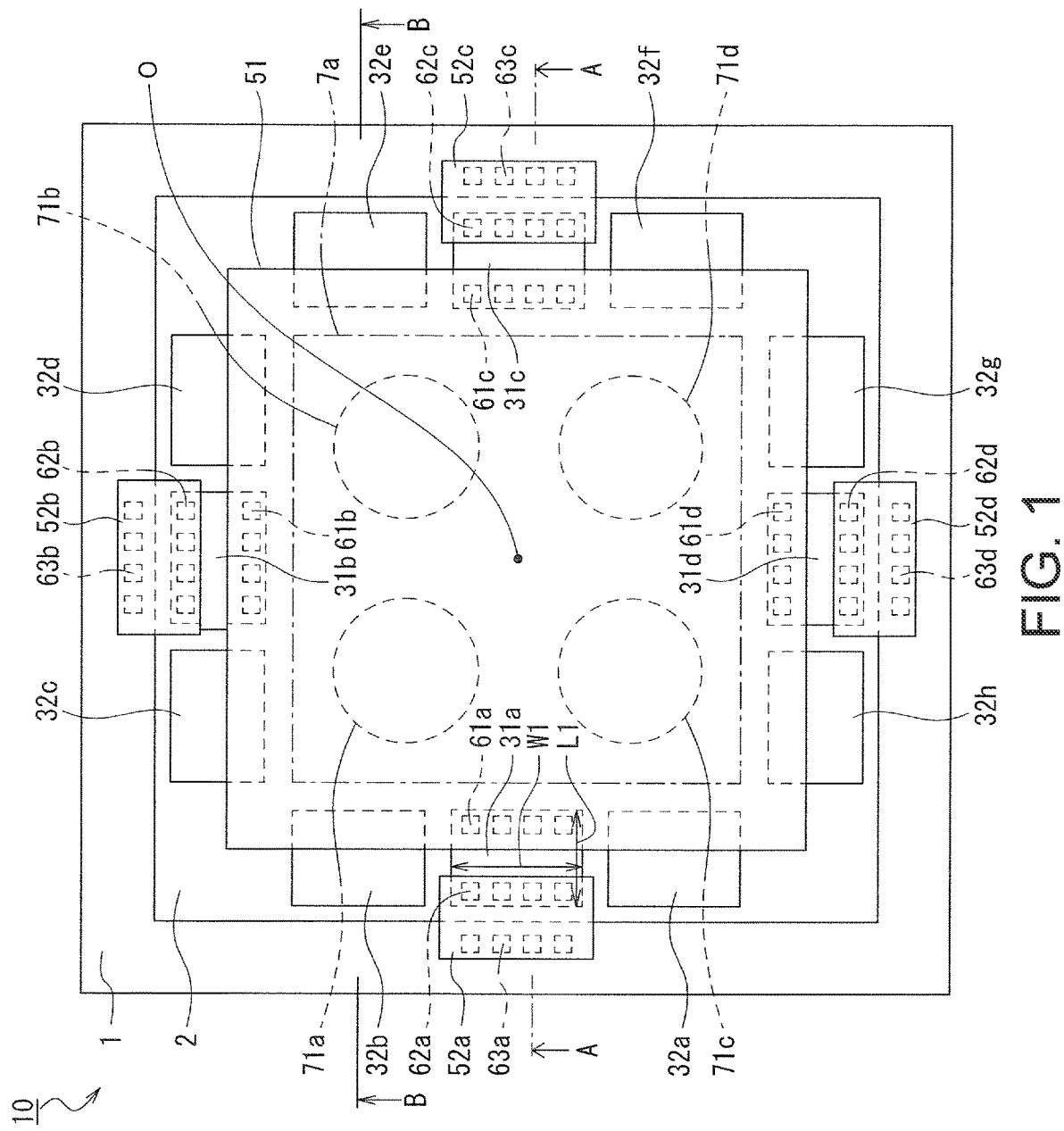
FIG. 1 is a plan view of a resistance element according to an embodiment of the present invention.

Hereinafter, embodiments of the present invention and variations thereof will be described with reference to the drawings. In the description of the drawings, the same or similar parts are designated by the same or similar reference numerals, and duplicate description will be omitted. However, the drawings are schematic, and the relationship between the thickness and the plane dimensions, the ratio of the thickness of each layer, etc., may differ from the actual ones. In addition, parts having different dimensional relationships and ratios may be included between the drawings. Further, the embodiments shown below exemplify devices and methods for embodying the technical idea of the present invention, and the technical idea of the present invention is not limited to those materials, shapes, structures, and arrangements, etc., of constituent parts, described below. Further, the definition of the direction such as up and down in the following description is merely a definition for convenience of explanation, and does not limit the technical idea of the present invention. For example, if the object is rotated by 90° and observed, the top and bottom are converted to left and right, and if the object is rotated by 180° and observed, the top and bottom are reversed.

EMBODIMENTS

<Resistance Element>

Figure 2:
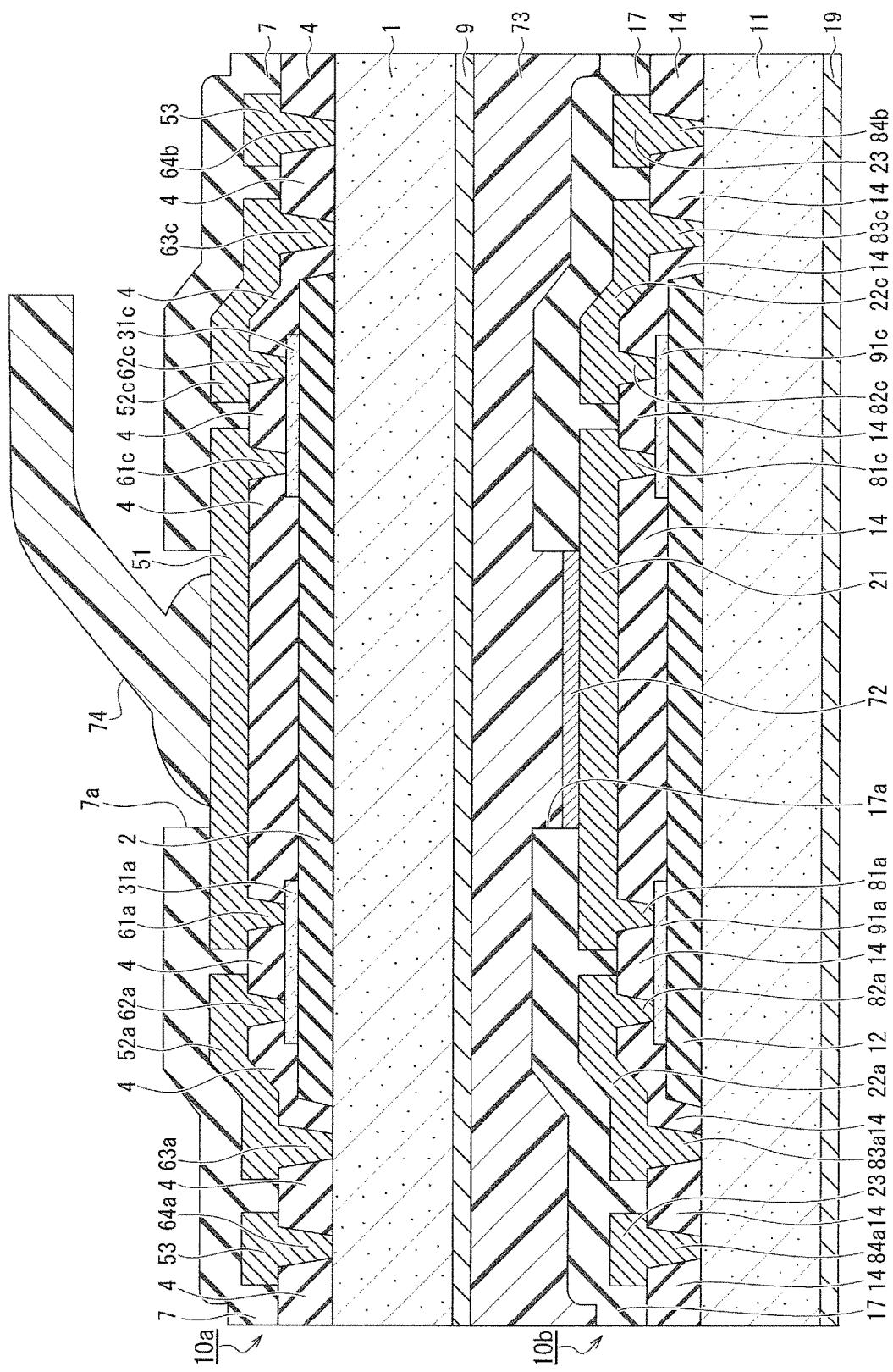
FIG. 2 is a cross-sectional view seen from the direction AA of FIG. 1.
Figure 3:
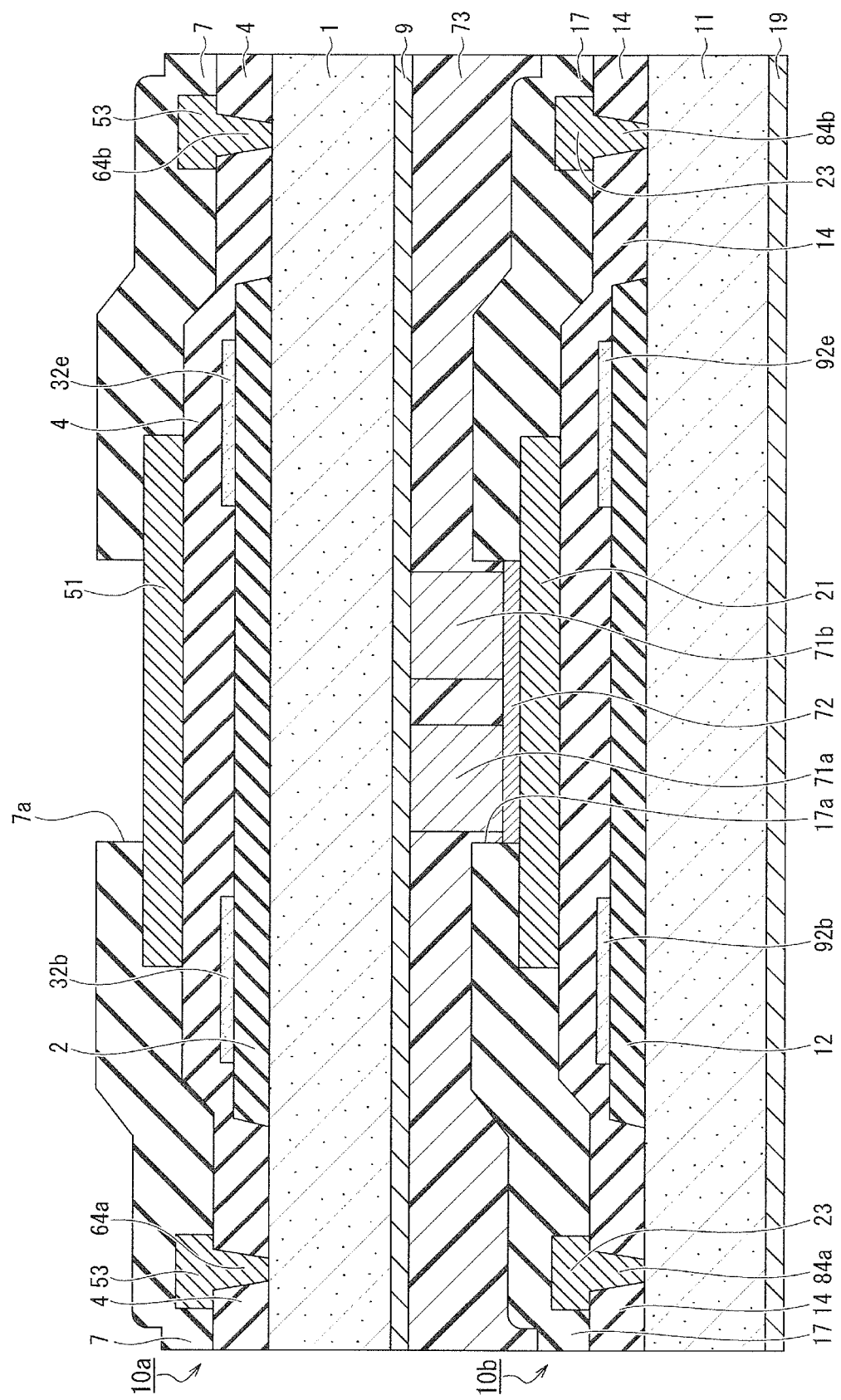
FIG. 3 is a cross-sectional view seen from the direction BB of FIG. 1.

FIG. 1 is a plan view of the resistance element according to the embodiment of the present invention, a cross-sectional view seen from the direction AA of FIG. 1 corresponds to FIG. 2 and a cross-sectional view seen from the direction BB of FIG. 1 corresponds to FIG. 3. As shown in FIGS. 1 to 3, the resistance element according to the embodiment of the present invention is formed by stacking a plurality (two) of resistance chips 10a and 10b having the same chip size (planar outer shape) in a plan view and connecting them in series. The electrical path between the pad forming electrode 51 of the resistance chip 10a, which is the uppermost stage among the resistance chips 10a and 10b, and the back surface electrode 19 of the resistance chip 10b, which is the lowermost stage among chips 10a and 10b, is used as a resistor. In FIGS. 1 to 3, since the two resistance chips 10a and 10b are stacked one over another, the upper resistance chip ("upper resistance chip") 10a becomes the uppermost stage, and the lower resistance chip ("lower resistance chip") 10b becomes the lowermost stage.

As shown in FIG. 1, the upper resistance chip 10a has a rectangular planar pattern. The planar pattern of the upper resistance chip 10a is not limited to a rectangle. The chip size of the upper resistance chip 10a is, for example, about 3 mm×3 mm, but it can be appropriately set to other dimensions. The upper resistance chip 10a includes resistance layers 31a to 31d provided along the respective sides of the rectangle of the upper resistance chip 10a.

In the cross-sectional structure shown in FIG. 2, the upper resistance chip 10a includes a semiconductor substrate 1 having a low resistivity, the field insulating film (first insulating film) 2 on the semiconductor substrate 1, and resistance layers 31a and 31c made of the thin film on the field insulating film 2. Although omitted in the cross-sectional structure of FIG. 2, the resistance layers 31b and 31d shown in FIG. 1 are arranged on the field insulating film 2 in the same manner as the resistance layers 31a and 31c shown in FIG. 2.

The thickness of the semiconductor substrate 1 is, for example, about 350 μm. As the semiconductor substrate 1, a substrate having a low resistivity such as a silicon substrate to which n-type impurities are added at a high concentration can be used. The resistance component of the semiconductor substrate 1 is preferably small to a negligible level with respect to the resistance components of the resistance layers 31a to 31d. That is, the resistance component of the semiconductor substrate 1 is preferably about 1/100 or less of the resistance components of the resistance layers 31a to 31d. The specific resistance of the semiconductor substrate 1 may be, for example, about 2 mΩ·cm to 60 mΩ·cm. As the semiconductor substrate 1, a silicon substrate to which p-type impurities are added at a high concentration or a semiconductor substrate other than silicon may be used instead.

The thickness of the field insulating film 2 is, for example, about 800 nm. Parasitic capacitance can be reduced by thickening the field insulating film 2. As the field insulating film 2, a silicon oxide film ($SiO_2$ film), a silicon nitride film ($Si_3N_4$ film), or a composite film thereof can be used. The field insulating film 2 may be an insulating film (TEOS film) obtained by a chemical vapor deposition (CVD) method or the like using tetraethoxysilane (TEOS) gas, which is an organic silicon compound.

As shown in FIG. 1, the resistance layers 31a to 31d have a rectangular planar pattern. The thickness of the resistance layers 31a to 31d is, for example, about 500 nm, and the sheet resistance of the resistance layers 31a to 31d is, for example, about 150Ω/□. As the resistance layers 31a to 31d, for example, an n-type doped polysilicon (DOPOS) layer can be used. The n-type DOPOS layer can be formed by ion-implanting n-type impurities such as phosphorus (P) into polycrystalline silicon (polysilicon) or by adding the impurities during deposition of polycrystalline silicon with a CVD apparatus. The resistance values of the resistance layers 31a to 31d can be controlled by adjusting the width W1 and the length L1 of the resistance layers 31a to 31d. Further, when the DOPOS layer is used for the resistance layers 31a to 31d, the resistance value of the resistance layers 31a to 31d can be controlled by adjusting the amount of the impurity element added to the polysilicon.

The temperature coefficient of the resistance layers 31a to 31d is preferably 0 ppm/° C. or less (in other words, the temperature coefficient of the resistance layers 31a to 31d is 0, or the temperature coefficients of the resistance layers 31a to 31d have a negative temperature coefficient). As a result, it is possible to suppress an increase in the resistance value during high-temperature operation. For example, when the resistance element according to the embodiment is applied as a gate resistance element of an insulated gate bipolar transistor (IGBT), it is possible to suppress the loss when the IGBT is turned on. The temperature coefficient of DOPOS can be controlled, for example, by adjusting the dose amount when ion-implanting impurities into polysilicon. For example, if the dose amount is about $7.0 \times 10^{15}$ $cm^{-2}$ or less, the temperature coefficient of DOPOS can be set to about 0 ppm/° C. or less. The temperature coefficient of the resistance layers 31a to 31d is not necessarily limited to 0 ppm/° C. or lower, and the resistance layers 31a to 31d may have a positive temperature coefficient, depending on specifications and/or applications.

The resistance layers 31a to 31d may be p-type DOPOS layers instead of n-type DOPOS layers. The p-type DOPOS layer can also be formed by a method such as ion implantation of p-type impurities such as boron (B) into polysilicon. The resistance layers 31a to 31d are not limited to the DOPOS layer, and may be a nitride film of a transition metal such as tantalum nitride ($TaN_x$), or may be a laminated film of metal films having a high melting point in which chromium (Cr), nickel (Ni), and manganese (Mn) are laminated in this order. As the resistance layers 31a to 31d, a thin film of silver palladium (AgPd) or ruthenium oxide ($RuO_2$) may also be used. Although the structure is different from that shown in FIGS. 1 and 2, it is also possible to realize the resistance layers 31a to 31d with a p-type diffusion layer or an n-type diffusion layer formed in the semiconductor surface.

As shown on the left side of FIG. 1, dummy layers 32a and 32b are arranged so as to sandwich the resistance layer 31a and to be separated from the resistance layer 31a. As shown on the upper side of FIG. 1, dummy layers 32c and 32d are arranged so as to sandwich the resistance layer 31b and to be separated from the resistance layer 31b. As shown on the right side of FIG. 1, dummy layers 32e and 32f are arranged so as to sandwich the resistance layer 31c and to be separated from the resistance layer 31c. As shown on the lower side of FIG. 1, dummy layers 32g and 32h are arranged so as to sandwich the resistance layer 31d and to be separated from the resistance layer 31d.

The dummy layers 32a to 32h are made of the same material as the resistance layers 31a to 31d such as n-type DOPOS, and have the same thickness as the resistance layers 31a to 31d. The width and length of the dummy layers 32a to 32h may be the same as or different from the width W1 and the length L1 of the resistance layers 31a to 31d. The dummy layers 32a to 32h do not necessarily have to be provided.

Although not shown in FIG. 1, as shown in FIGS. 2 and 3, the interlayer insulating film (second insulating film) 4 is arranged so as to cover the field insulating film 2 and the resistance layers 31a to 31d. The thickness of the interlayer insulating film 4 is, for example, about 1500 nm. As the interlayer insulating film 4, a single layer film of a so-called "NSG film", which is a silicon oxide film ($SiO_2$ film) containing no phosphorus (P) or boron (B), a silicon oxide film to which phosphorus is added (PSG film), a silicon oxide film to which boron is added (BSG film), a silicon oxide film to which phosphorus and boron are added (BPSG film), or a silicon nitride film ($Si_3N_4$ film), or a composite film obtained by selecting and combining these multiple types of films can be used. For example, the interlayer insulating film 4 can be composed of a composite film in which an NSG film of about 770 nm thickness and a PSG film of about 650 nm thickness are laminated. The NSG film has a function of suppressing resistance variation. Further, the PSG film has a function of ensuring the strength of wire bonding.

The pad forming electrode 51 is located above the field insulating film 2 as shown in FIGS. 2 and 3. As shown in FIG. 1, the pad forming electrode 51 has a rectangular planar pattern. The center O of the rectangular planar pattern of the pad forming electrode 51 is located at the center of the chip. As shown in FIGS. 1 and 2, the left end portion of the pad forming electrode 51 overlaps the right end portion of the resistance layer 31a in the depth direction. The pad forming electrode 51 is connected to one end of the resistance layer 31a via the electrode contact area 61a.

As shown in FIG. 1, the upper end portion of the pad forming electrode 51 overlaps one end of the resistance layer 31b in the depth direction. The pad forming electrode 51 is connected to one end of the resistance layer 31b via the electrode contact area 61b. As shown in FIGS. 1 and 2, the right end portion of the pad forming electrode 51 overlaps the left end portion of the resistance layer 31c in the depth direction. The pad forming electrode 51 is connected to one end of the resistance layer 31c via the electrode contact area 61c. As shown in FIG. 1, the lower end portion of the pad forming electrode 51 overlaps one end of the resistance layer 31d in the depth direction. The pad forming electrode 51 is connected to one end of the resistance layer 31d via the electrode contact area 61d.

As shown in FIGS. 1 to 3, relay wirings 52a to 52d are arranged on the interlayer insulating film 4 so as to surround the pad forming electrode (surface electrode) 51 at the center and to be separated from the pad forming electrode 51. The planar patterns of the pad forming electrodes 51, the resistance layers 31a to 31d, and the relay wirings 52a to 52d are 4-turn rotationally symmetric with respect to the center O of the chip. As a result, the resistance element of the embodiment may be mounted with rotation of 90° or 180°, which facilitates the assembly work.

As shown in FIG. 2, the position of the right end portion of the relay wiring 52a overlaps the other end of the resistance layer 31a in the depth direction. A resistance layer connection terminal, which is one end (first end portion) of the relay wiring 52a, contacts the other end of the resistance layer 31a via the wiring contact area 62a. The position of the left end portion of the relay wiring 52c overlaps the other end of the resistance layer 31c in the depth direction. A resistance layer connection terminal, which is one end (first end portion) of the relay wiring 52c, contacts the other end of the resistance layer 31c via the wiring contact area 62c.

Although not shown, the position of the end portion of the relay wiring 52b overlaps the other end of the resistance layer 31b in the depth direction on the rear side of the paper surface of FIG. 2. A resistance layer connection terminal, which is one end (first end portion) of the relay wiring 52c, contacts the other end of the resistance layer 31b via the wiring contact area 62b. On the front side of the paper surface of FIG. 2, the position of the end portion of the relay wiring 52d overlaps the other end of the resistance layer 31d in the depth direction. A resistance layer connection terminal, which is one end (first end portion) of the relay wiring 52d, contacts the other end of the resistance layer 31d via the wiring contact area 62d.

As shown in FIGS. 1 and 2, a substrate connection terminal, which is the other end (second end portion) of each of the relay wirings 52a to 52d, contact the semiconductor substrate 1 via the substrate contact area (63a to 63d) with a low contact resistance, ohmic contact. A contact area having a higher impurity concentration (low resistivity) than the semiconductor substrate 1 and having the same conductive type as the semiconductor substrate 1 may be provided on the upper portion of the semiconductor substrate 1 which is a contact point between the substrate contact areas 63a to 63d and the semiconductor substrate 1.

The thickness of the pad forming electrode 51 and the relay wirings 52a to 52d is, for example, about 3 μm. The pad forming electrodes 51 and the relay wirings 52a to 52d are, for example, a laminated film of titanium/titanium nitride (Ti/TiN) as a barrier metal of about 120 nm, aluminum-silicon (Al—Si) of about 3 μm, and an antireflection film of TiN/Ti of about 45 nm. Instead of Al—Si, Al or an Al alloy such as Al—Cu—Si, Al—Cu, or the like may be used. A bonding wire 74 made of a metal such as aluminum (Al) and having a diameter of about 300 μm is connected to the pad forming electrode 51.

Although not shown in FIG. 1, a guard ring layer 53 is arranged on the interlayer insulating film 4 as shown in FIGS. 2 and 3. The guard ring layer 53 is arranged in a ring shape on the outer peripheral portion of the chip constituting the resistance element according to the embodiment. The guard ring layer 53 is in contact with the semiconductor substrate 1 via the peripheral contact areas 64a and 64b. The guard ring layer 53 is made of the same material as the pad forming electrode 51 and the relay wirings 52a to 52d. The guard ring layer 53 may have a function of preventing the intrusion of moisture from the side surfaces of the chip.

As shown in FIGS. 2 and 3, a protective insulating film (third insulating film) 7 is arranged on the pad forming electrodes 51, the relay wirings 52a to 52d, and the guard ring layer 53. The protective insulating film 7 can be composed of, for example, a composite film in which a TEOS film, a $Si_3N_4$ film, and a polyimide film are laminated in this order. The protective insulating film 7 is provided with an opening 7a. In FIG. 1, the protective insulating film 7 is not shown, and only the opening 7a of the protective insulating film 7 is shown by the alternate long and short dash line. The portion of the pad forming electrode 51 exposed from the opening 7a becomes a pad region to which the bonding wire can be connected.

As shown in FIGS. 2 and 3, a back surface electrode (opposite electrode) 9 is arranged on the lower surface of the semiconductor substrate 1. The back surface electrode 9 can be composed of, for example, a single-layer film made of gold (Au) or a metal film in which titanium (Ti), nickel (Ni), and gold (Au) are laminated in this order. The outermost layer of the back surface electrode 9 can be made of a solderable material. In the upper resistance chip 10a, four resistance layers 31a to 31d are connected in parallel between the pad forming electrode 51 and the back surface electrode 9, and the electrical path between the pad forming electrode 51 and the back surface electrode 9 is used as a resistor.

The upper resistance chip 10a is provided with four resistance layers 31a to 31d, but by adjusting the presence or absence of the electrode contact areas 61a to 61d, the wiring contact areas 62a to 62d, and the substrate contact areas 63a to 63d, the resistance layers 31a to 31d can be selectively used. For example, when the resistance layer 31a out of the four resistance layers 31a to 31d is selectively used, among the electrode contact areas 61a to 61d, the wiring contact areas 62a to 62d, and the substrate contact areas 63a to 63d, only the electrode contact area 61a, the wiring contact area 62a, and the substrate contact area 63a may be provided.

When the resistance values of the resistance layers 31a to 31d are 120Ω each, if any one of the resistance layers 31a to 31d is connected, the resistance value of the upper resistance chip 10a becomes 120Ω. When any three of the resistance layers 31a to 31d are connected in parallel, the resistance value of the upper resistance chip 10a becomes 40Ω. When any two of the resistance layers 31a to 31d are connected in parallel, the resistance value of the upper resistance chip 10a becomes 60Ω. When four resistance layers 31a to 31d are connected in parallel as shown in FIGS. 1 and 2, the resistance value of the upper resistance chip 10a becomes 30Ω. In this way, the resistance value of the upper resistance chip 10a can be adjusted by increasing or decreasing the number of parallel connections of the resistance layers 31a to 31d.

In the resistance element according to the embodiment, as shown in FIGS. 2 and 3, the lower resistance chip 10b has the same structure as the upper resistance chip 10a, and has the same resistance value as the upper resistance chip 10a. Although the planar pattern of the lower resistance chip 10b is not shown, it is the same as the upper resistance chip 10a shown in FIG. 1. Here, the number of resistance layers used in the upper resistance chip 10a and the lower resistance chip 10b may instead be different from each other so that the resistance values are different from each other.

In the cross-sectional structure shown in FIG. 2, the lower resistance chip 10b includes a semiconductor substrate 11 having a low resistivity, a field insulating film (first insulating film) 12 arranged on the semiconductor substrate 11, and resistance layers 91a and 91c made of a thin film on the field insulating film 12. Although omitted in the cross-sectional structure of FIG. 2, two more resistance layers are arranged on the field insulating film 12 as in the upper resistance chip 10a. Further, as shown in FIG. 3, dummy layers 92b and 92d are arranged on the field insulating film 12.

As shown in FIG. 2, an interlayer insulating film (second insulating film) 14 is arranged so as to cover the field insulating film 12 and the resistance layers 91a and 91c. A pad forming electrode 21 is provided above the field insulating film 12. The left end portion of the pad forming electrode 21 overlaps the right end portion of the resistance layer 91a in the depth direction. The pad forming electrode 21 is connected to one end of the resistance layer 91a via the electrode contact area 81a. The right end of the pad forming electrode 21 overlaps the left end of the resistance layer 91c in the depth direction. The pad forming electrode 21 is connected to one end of the resistance layer 91c via the electrode contact area 81c.

Relay wirings 22a and 22c are arranged on the interlayer insulating film 14 so as to surround the pad forming electrode (surface electrode) 21 at the center so as to be separated from the pad forming electrode 21. The position of the right end portion of the relay wiring 22a overlaps the other end of the resistance layer 91a in the depth direction. A resistance layer connection terminal, which is one end (first end portion) of the relay wiring 22a, contacts the other end of the resistance layer 91a via the wiring contact area 82a. The position of the left end portion of the relay wiring 22c overlaps the other end of the resistance layer 91c in the depth direction. A resistance layer connection terminal, which is one end (first end portion) of the relay wiring 22c, contacts the other end of the resistance layer 91c via the wiring contact area 82c. A substrate connection terminal, which is the other end (second end portion) of each of the relay wirings 22a and 22c, is in contact with the semiconductor substrate 11 via the substrate contact areas 83a and 83c with low contact resistance, ohmic contact.

A guard ring layer 23 is arranged on the interlayer insulating film 14. The guard ring layer 23 is in contact with the semiconductor substrate 1 via the peripheral contact areas 84a and 84b.

A protective insulating film (third insulating film) 17 is arranged on the pad forming electrode 21, the relay wirings 22a and 22c, and the guard ring layer 23. The protective insulating film 17 is provided with an opening 17a that exposes a part of the pad forming electrode 21. A back surface electrode (opposite electrode) 19 is arranged on the lower surface of the semiconductor substrate 11. In the lower resistance chip 10b, two resistance layers 91a and 91c and two resistance layers (not shown) are connected in parallel between the pad forming electrode 21 and the back surface electrode 19, thereby forming a resistor in the electrical path between the pad forming electrode 21 and the back surface electrode 19.

The lower resistance chip 10b further has a plating layer 72 provided on the pad forming electrode 21 exposed from the opening 17a of the protective insulating film 17. The plating layer 72 is made of, for example, copper (Cu), nickel (Ni), tin (Sn), or the like. If the pad forming electrode 21 of the lower resistance chip 10b can be directly bonded to the bonding layers 71a to 71d described later, the plating layer 72 may not be needed. The thickness of the plating layer 72 is formed to be thinner than the thickness of the protective insulating film 17.

As shown in FIGS. 1 and 3, the back surface electrode 9 of the upper resistance chip 10a and the plating layer 72 of the lower resistance chip 10b are bonded by the bonding layers 71a to 71d. In FIG. 1, the arrangement positions of the bonding layers 71a to 71d between the back surface electrode 9 of the upper resistance chip 10a and the plating layer 72 of the lower resistance chip 10b are schematically shown by broken lines. The bonding layers 71a to 71d are arranged apart from each other.

As the material of the bonding layers 71a to 71d, a conductive material, such as a solder, a sintered material, or an adhesive, for example, can be used. The bonding layers 71a to 71d may be composed of, for example, solder balls or bumps. As the solder, tin antimony (SnSb) based materials and tin-silver (SnAg) based materials, for example, can be used. As the sintered material, for example, a silver (Ag) based or copper (Cu)-based metal particle paste (conductive paste) or the like can be used. The resistance values of the bonding layers 71a to 71d are very small compared to the resistance values of the upper resistance chip 10a and the lower resistance chip 10b, and do not affect the resistance value of the resistance element in the embodiment.

Figure 4:
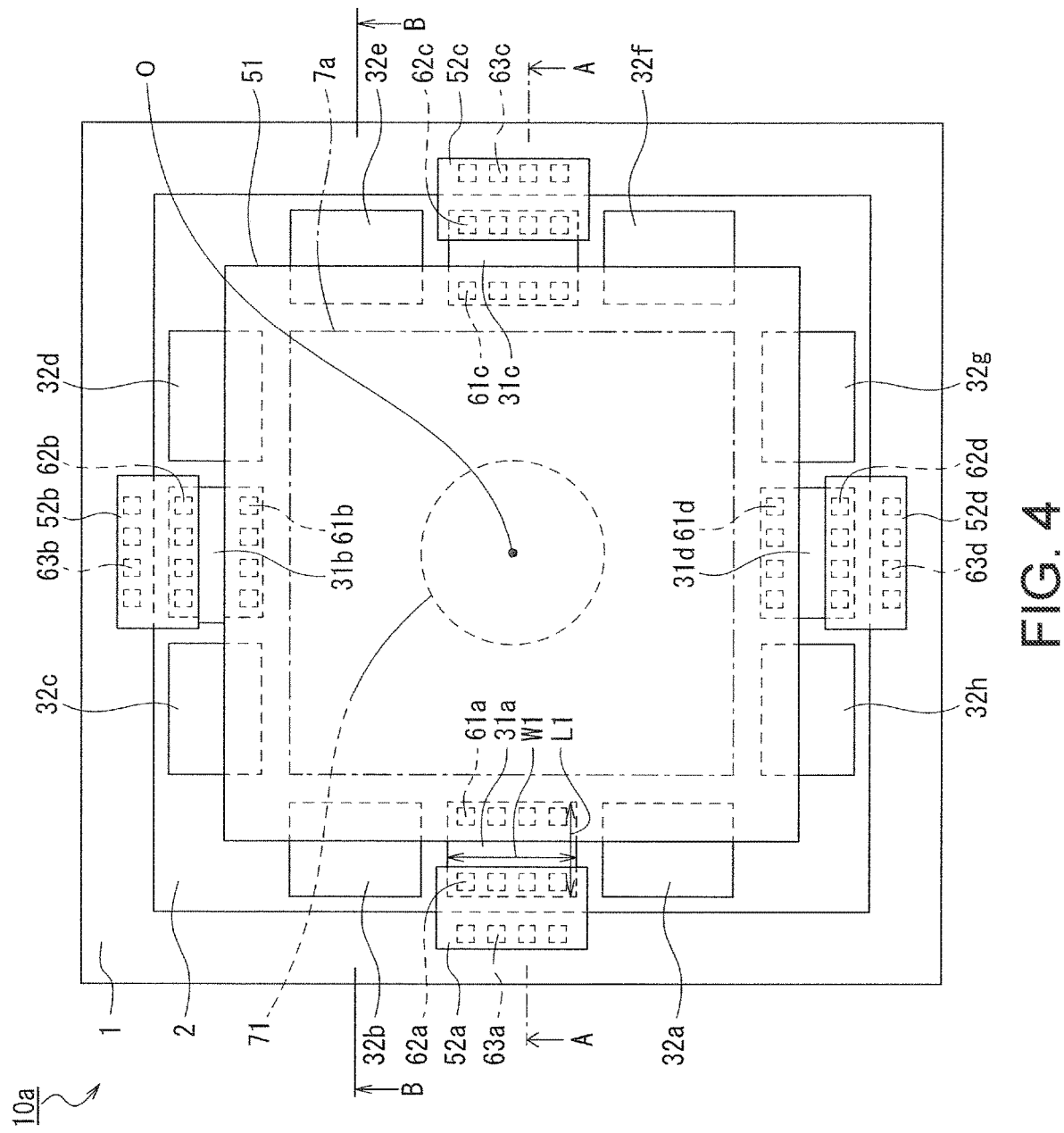
FIG. 4 is another plan view of the resistance element according to the embodiment.
Figure 5:
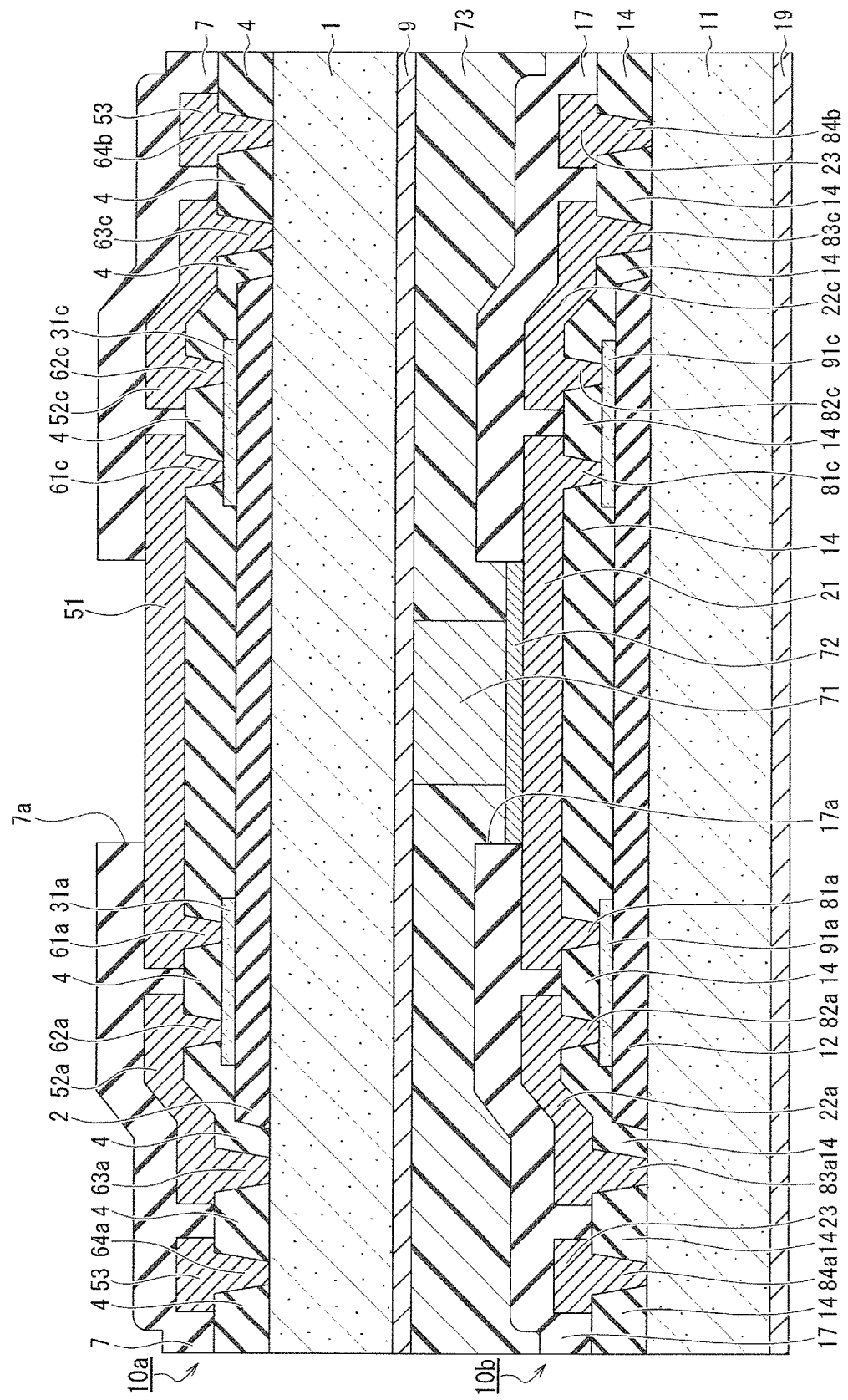
FIG. 5 is a cross-sectional view seen from the direction AA of FIG. 4.

Although the case where the bonding layers 71a to 71d are provided at four locations is illustrated, the number and arrangement positions of the bonding layers 71a to 71d are not particularly limited. FIG. 4 is a plan view the resistance element showing another such arrangement for the embodiment, and FIG. 5 is a cross-sectional view seen from the direction AA of FIG. 4 In FIG. 4, the arrangement position of the bonding layer 71 between the back surface electrode 9 of the upper resistance chip 10a and the plating layer 72 of the lower resistance chip 10b is schematically shown by a broken line. As shown in FIGS. 4 and 5, as an alternative arrangement, the bonding layer 71 for joining the upper resistance chip 10a and the lower resistance chip 10b may be provided at one position in the center of the upper resistance chip 10a and the lower resistance chip 10b.

As shown in FIGS. 2 and 3, an insulating layer 73 is provided between the back surface electrode 9 of the upper resistance chip 10a and the plating layer 72 of the lower resistance chip 10b. The insulating layer 73 is made of an insulating material such as a polyimide resin or a silicone gel. The resistance element according to the embodiment does not necessarily have to have the insulating layer 73. The insulating layer 73 may be composed of a part of a sealing material when the resistance element according to the embodiment is sealed together with the semiconductor chip in a semiconductor module in which the resistance element according to the embodiment is mounted.

Figure 6:
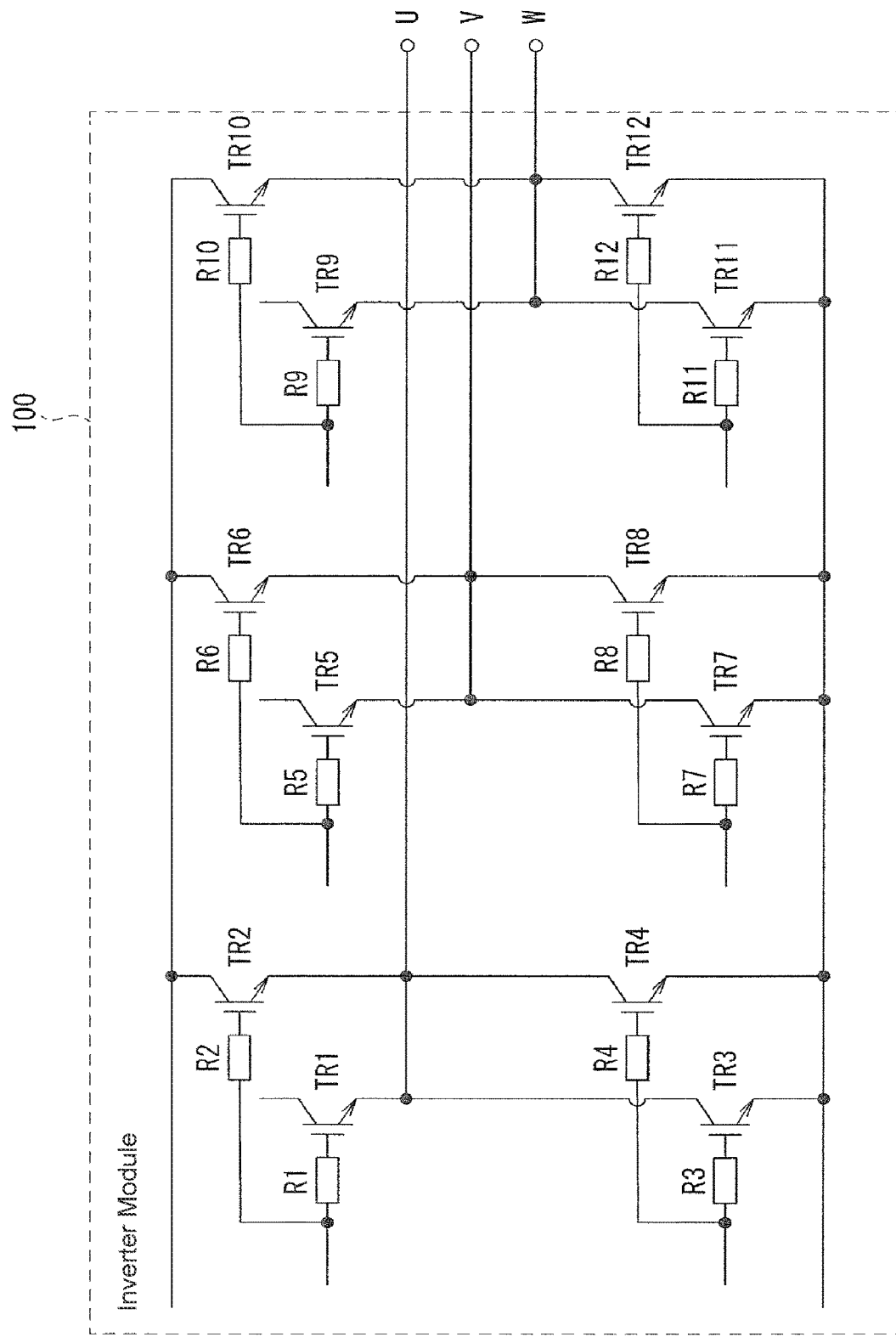
FIG. 6 is a circuit diagram showing an application example of the resistance element according to the embodiment.

As shown in FIG. 6, the resistance element according to the embodiment can be applied to an inverter module 100 for driving a three-phase motor composed of, for example, u-phase, v-phase, and w-phase. The inverter module 100 includes main elements TR1 to TR4 for driving the u phase, main elements TR5 to TR8 for driving the v phase, and main elements TR9 to TR12 for driving the w phase. Freewheeling diodes (not shown) are connected to the main elements TR1 to TR12, respectively. An IGBT, MOSFET, or the like can be used for each of the main elements TR1 to TR12. Gate resistors R1 to R12 are connected to the gate electrodes of the main elements TR1 to TR12, respectively, in order to suppress the oscillation phenomenon during the switching operation.

The resistance element according to the embodiment can be applied to each of the gate resistances R1 to R12. For example, when the resistance element according to the embodiment is applied to the gate resistance R1, the side where the gate resistance R1 is connected to the gate electrode of the main element TR1 corresponds to the pad forming electrode 51 side of the upper resistance chip 10a shown in FIGS. 1 to 3. Further, the side opposite to the side where the gate resistor R1 is connected to the gate electrode of the main element TR1 corresponds to the terminal on the back surface electrode 19 side of the lower resistance chip 10b shown in FIGS. 2 and 3.

According to the resistance element of the embodiment, the upper resistance chip 10a and the lower resistance chip 10b having the same chip size are connected vertically in series, and the electrical path between the pad forming electrode 51 of the resistance chip 10a and the back surface electrode 19 of the resistance chip 10b is used as a resistor. As a result, it is possible to increase the overall resistance value while ensuring a sufficient ESD withstand capacity without changing the mounting area of the semiconductor module. Further, since the resistance value can be adjusted by combining the upper resistance chip 10a and the lower resistance chip 10b, the degree of freedom of the resistance value can be improved.

<Manufacturing Method of a Resistance Element>

Next, an example of a method for manufacturing a resistance element according to an embodiment will be described with reference to FIGS. 1 to 3. The method for manufacturing a resistance element described below is an example, and various other manufacturing methods including a modification of the below examples may be used as long as they are within the scope of the claims.

First, the upper resistance chip 10a and the lower resistance chip 10b having the same chip size (the same outer planar shape) shown in FIGS. 1 to 3 are prepared. Then, the plating layer 72 is formed on the pad forming electrode 21 of the lower resistance chip 10b. The lower resistance chip 10b in which the plating layer 72 is formed in advance may be prepared.

Next, the back surface electrode 9 of the upper resistance chip 10a and the plating layer 72 of the lower resistance chip 10b are joined via the bonding layers 71a to 71d. For example, the bonding layers 71a to 71d made of solder balls are mounted on the plating layer 72 of the lower resistance chip 10b. Subsequently, the back surface electrode 9 of the upper resistance chip 10a is mounted on the bonding layers 71a to 71d. Then, a heat treatment is performed to melt the bonding layers 71a to 71d so that the back surface electrode 9 of the upper resistance chip 10a and the plating layer 72 of the lower resistance chip 10b are bonded via the bonding layers 71a to 71d.

Next, the insulating layer 73 is formed by filling a space between the back surface electrode 9 of the upper resistance chip 10a and the plating layer 72 and the protective insulating film 17 of the lower resistance chip 10b with a gel-like resin or the like. As a result, the resistance element according to the embodiment shown in FIGS. 1 to 3 is completed.

<Semiconductor Module>

Figure 7:
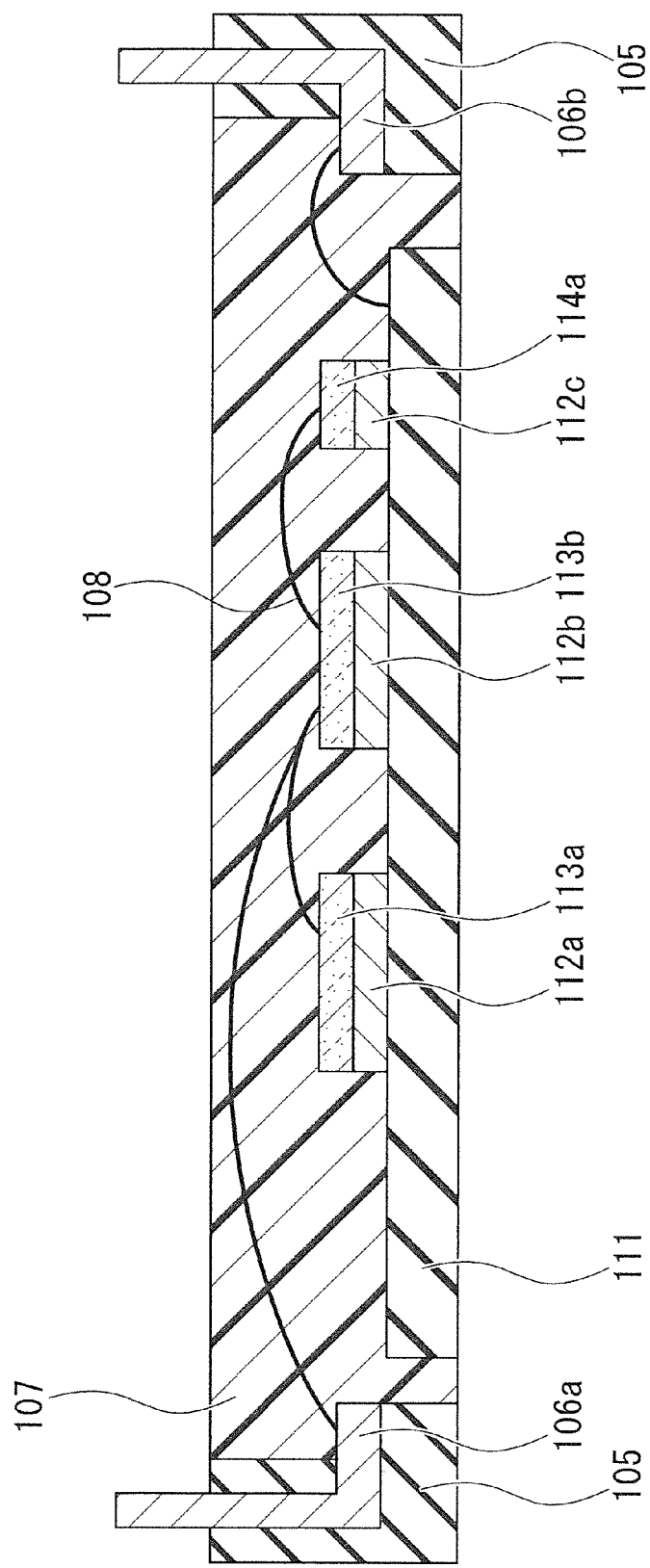
FIG. 7 is a cross-sectional view of a semiconductor module according to an embodiment.

As shown in FIG. 7, the semiconductor module according to an embodiment of the present invention includes an insulating circuit board 111, semiconductor chips 113a and 113b mounted on the insulating circuit board 111, and a stacked resistance chip 114a mounted on the insulating circuit board 111, apart from semiconductor chips 113a and 113b.

The insulating circuit board 111 may be, for example, a direct bonded copper (DBC) substrate, an active metal braze (AMB) substrate, or the like. The insulating circuit board 111 is composed of an insulating substrate and conductor layers arranged on the upper surface and the lower surface of the insulating substrate, respectively. The semiconductor chips 113a and 113b are bonded to the conductor layer on the upper surface side of the insulating circuit board 111 via bonding layers 112a and 112b, respectively. The semiconductor chip 113a is, for example, a freewheeling diode (FWD) connected in antiparallel to the semiconductor chip 113b. The semiconductor chip 113b is, for example, an IGBT that is a switching element.

The stacked resistance chip 114a is bonded to the conductor layer on the upper surface side of the insulating circuit board 111 via the bonding layer 112c. The stacked resistance chip 114a is the resistance element shown in FIGS. 1 to 3 in which the upper resistance chip 10a and the lower resistance chip 10b are stacked.

The insulating circuit board 111, the semiconductor chips 113a and 113b, and the stacked resistance chip 114a are housed in a case 105. The case 105 is filled with a sealing material 107 to seal the semiconductor chips 113a and 113b and the stacked resistance chip 114a therein. External terminals 106a and 106b are attached to the case 105. The insulating circuit board 111, the semiconductor chips 113a and 113b, the stacked resistance chips 114a and the external terminals 106a and 106b are connected to each other via the bonding wires 108.

<Manufacturing Method of a Semiconductor Module>

Figure 8:
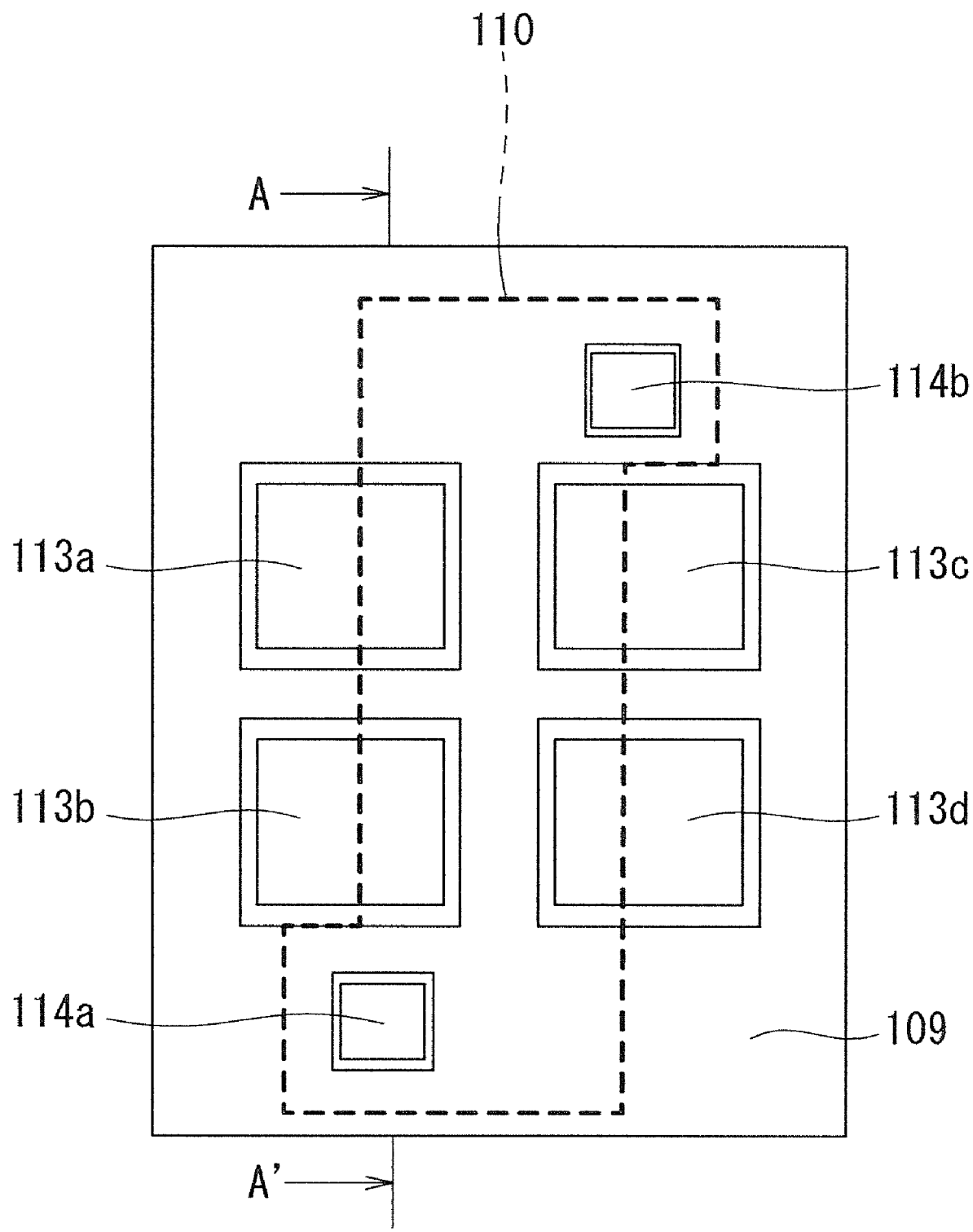
FIG. 8 is a plan view for a method for manufacturing a semiconductor module according to an embodiment.
Figure 9:
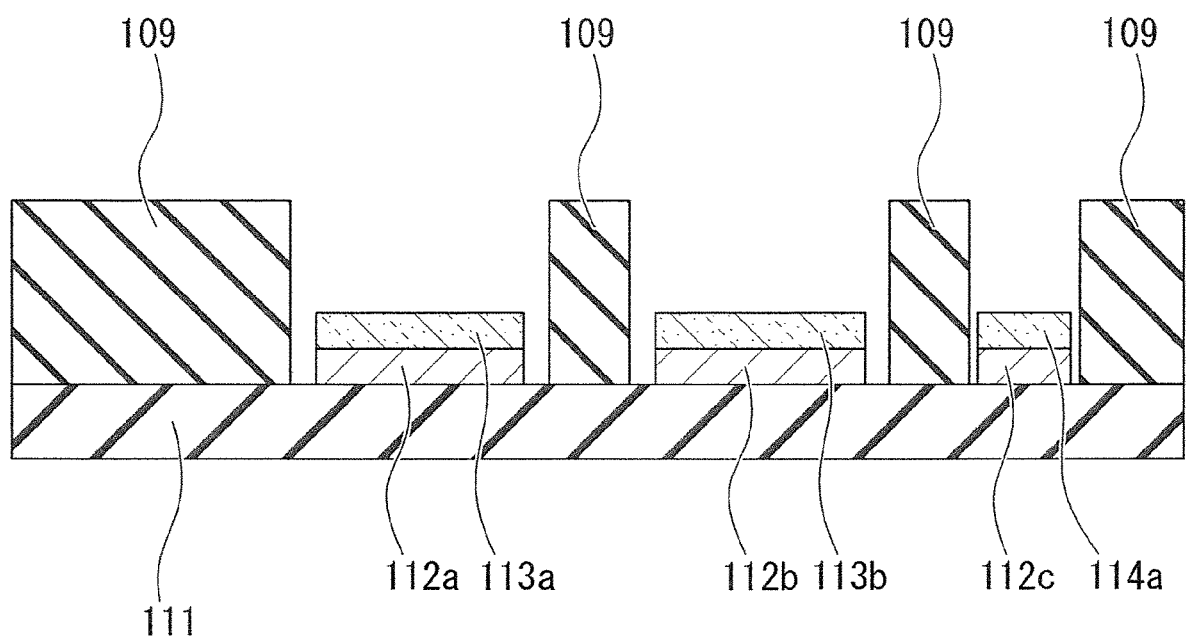
FIG. 9 is a cross-sectional view seen from the direction AA' in FIG. 8.

Next, a manufacturing method (assembly method) of the semiconductor module according to the embodiment of the present invention will be described with reference to FIGS. 7 to 10. First, as shown in FIGS. 8 and 9, an alignment jig 109 made of carbon or the like is mounted on the insulating circuit board 111. Subsequently, the semiconductor chips 113a to 113d and the stacked resistance chips 114a and 114b are mounted in the respective openings of the jig 109 on the insulating circuit board 111 via the bonding layers 112a to 102c and the like. For example, the semiconductor chips 113a and 113d are each a freewheeling diode (FWD), and the semiconductor chips 113b and 113c are each an IGBT.

Figure 10:
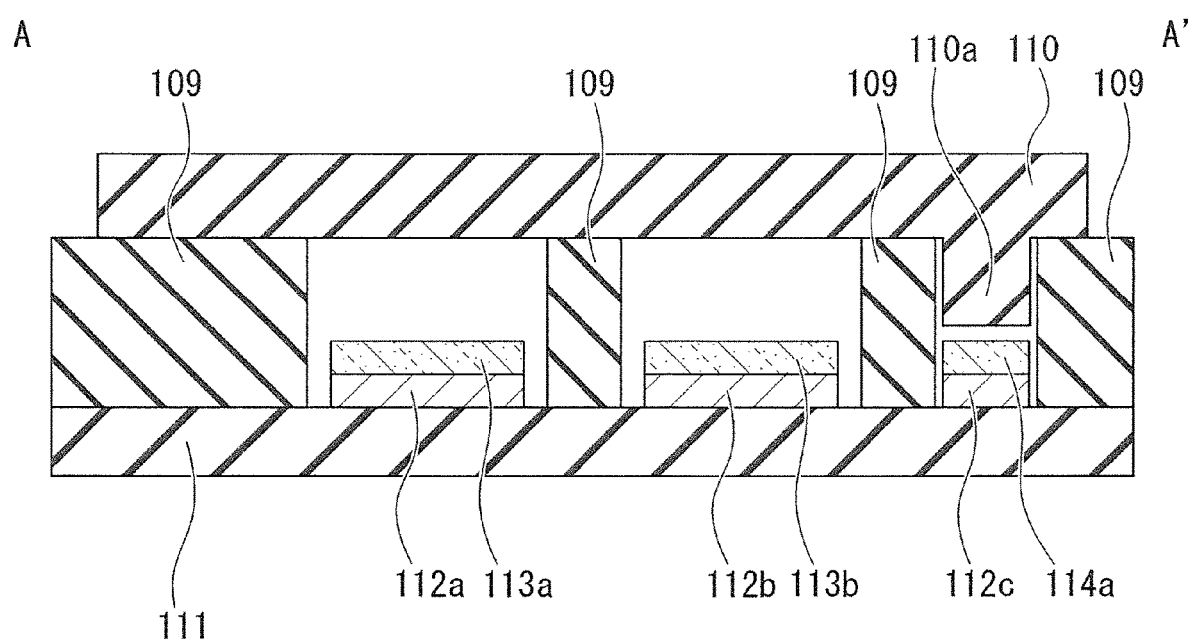
FIG. 10 is a cross-sectional view for a method for manufacturing a semiconductor module according to an embodiment.

Since the stacked resistance chips 114a and 114b are smaller than the semiconductor chips 113a to 113d, they tend to tilt due to the surface tension of the bonding layers 112a to 102c after solder melting. Therefore, next, as shown in FIG. 10, a jig 110 for fixing the stacked resistance chips 114a and 114b is used so that the inclination of the stacked resistance chip 114a is suppressed by the protruding portion 110a of the jig 110. FIG. 8 schematically shows the planar pattern of the jig 110 with a broken line. For example, when the stacked resistance chip 114a is arranged parallel to the upper surface of the insulating circuit board 111, a protruding portion 110a may be provided so as to be separated from the stacked resistance chip 114a. The protruding portion 110a of the jig 110 may be integrally formed with the jig 110 and may be made of carbon or the like. Alternatively, the protruding portion 110a may be made of an elastic member such as rubber. Although not shown, a protruding portion is also provided at a position corresponding to the stacked resistance chip 114b in the jig 110.

With the jig 110 arranged, a heat treatment is applied to join the insulating circuit board 111 with the semiconductor chips 113a to 113d and the stacked resistance chips 114a, 114b via the bonding layers 112a to 112c and the like. As the bonding layers 112a to 112c and the like, materials having a lower bonding temperature (melting point) than the bonding layers 71a to 71d for bonding the upper resistance chips 10a and the lower resistance chips 10b of the stacked resistance chips 114a and 114b, respectively, may be used. For example, a sintered material may be used as the bonding layers 71a to 71d, and solder may be used as the bonding layers 112a to 112c. Then, by performing the heat treatment at a temperature lower than the bonding temperature (melting point) of the bonding layers 71a to 71d, the insulating circuit board 111 and the semiconductor chips 113a to 113d and the stacked resistance chips 114a and 114b can be bonded together via the bonding layers 112a to 112c and the like without melting the bonding layers 71a to 71d of the stacked resistance chips 114a and 114b, respectively.

Next, the insulating circuit board 111, the semiconductor chips 113a and 113b, the stacked resistance chips 114a and the external terminals 106a and 106b are connected to each other via the bonding wires 108. Subsequently, the insulating circuit board 111, the semiconductor chips 113a to 113d, and the stacked resistance chips 114a, 114b are housed in the case 105 to which the external terminals 106a, 106b are attached. Then, the semiconductor module according to the embodiment of the present invention is completed by filling the case 105 with the sealing material 107.

Here, instead of mounting the stacked resistance chips 114a and 114b in which the upper resistance chips 10a and the lower resistance chips 10b have been already bonded via the bonding layers 71a to 71d on the insulating circuit board 111, the lower resistance chips 10b, the bonding layers 71a to 71d, and the upper resistance chips 10a may be sequentially mounted on the insulating circuit board 111 in a state where they are not bonded to each other. Then, during the heat treatment for bonding the insulating circuit board 111 to the semiconductor chips 113a to 113d and the stacked resistance chips 114a, 114b via the bonding layers 112a to 112c and the like, the upper resistance chip 10a and the lower resistance chip 10b may be joined together via the bonding layers 71a to 71d, thereby forming the stacked resistance chips 114a and 114b. In this case, the bonding layers 112a to 112c and the like and the bonding layers 71a to 71d may be made of the same material.

Further, in the above-described "Manufacturing method of a resistance element," the insulating layer 73 may be omitted. Then, when the sealing material 107 is filled in the case 105, the sealing material 107 is used to fill a space between the back surface electrode 9 of the upper resistance chip 10a and the plating layer 72 and the protective insulating film 17 of the lower resistance chip 10b, thereby constituting an equivalent of the insulating layer 73. Further, in the above-described Manufacturing method of a resistance element," the insulating layer 73 may be formed to cover only a portion of the space between the upper resistance chip 10a and the lower resistance chip 10b, such as joint portions between the plating layer 72 and the bonding layers 71a to 71d. Then, the remaining portion of the space between the upper resistance chip 10a and the lower resistance chip 10b may be filled with the sealing material 107 that is filled in the case 105 so as to constitute an equivalent of the insulating layer 73.

First Modification Example

Figure 11:
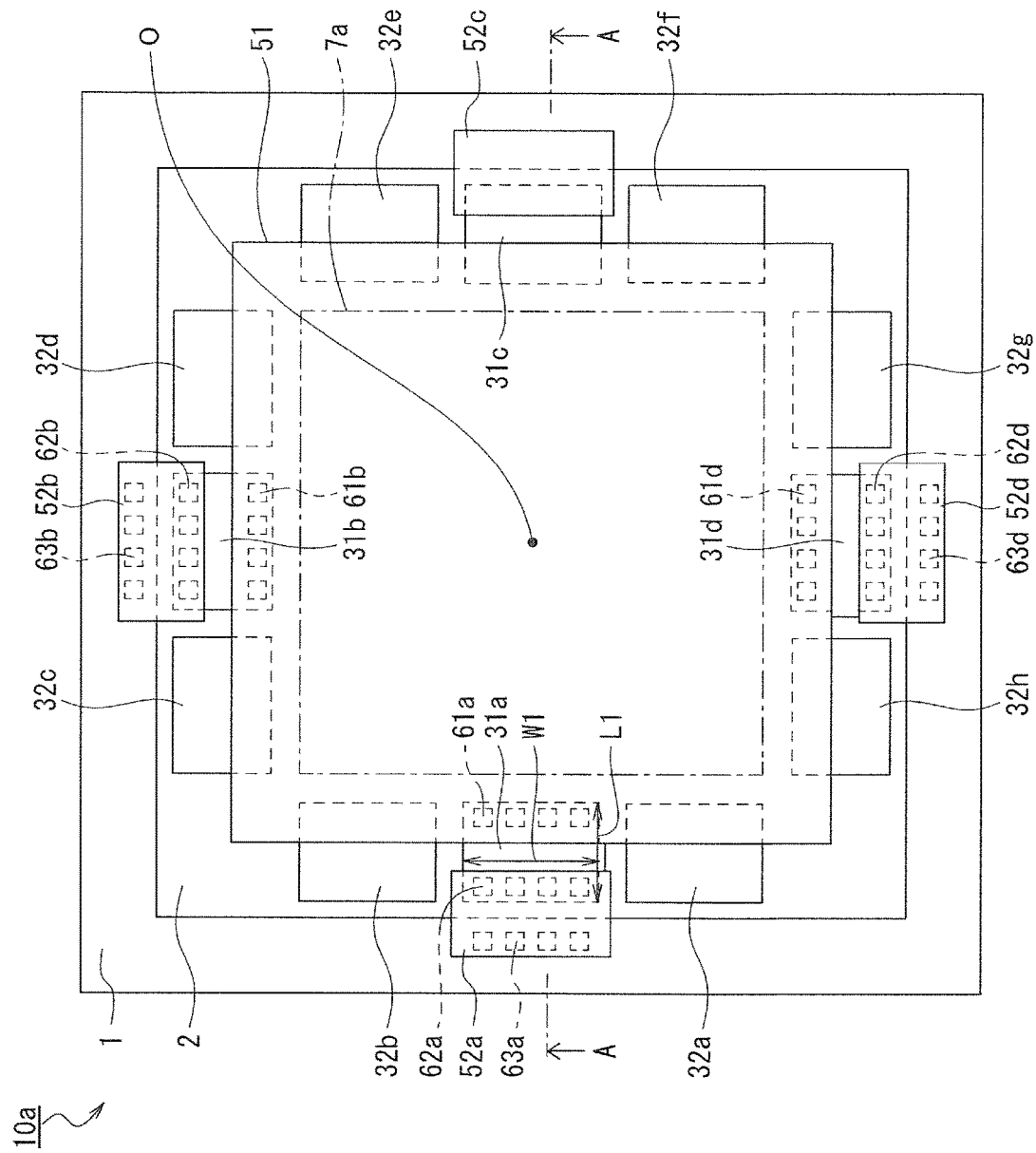
FIG. 11 is a plan view of a resistance element according to a first modification of the embodiment.
Figure 12:
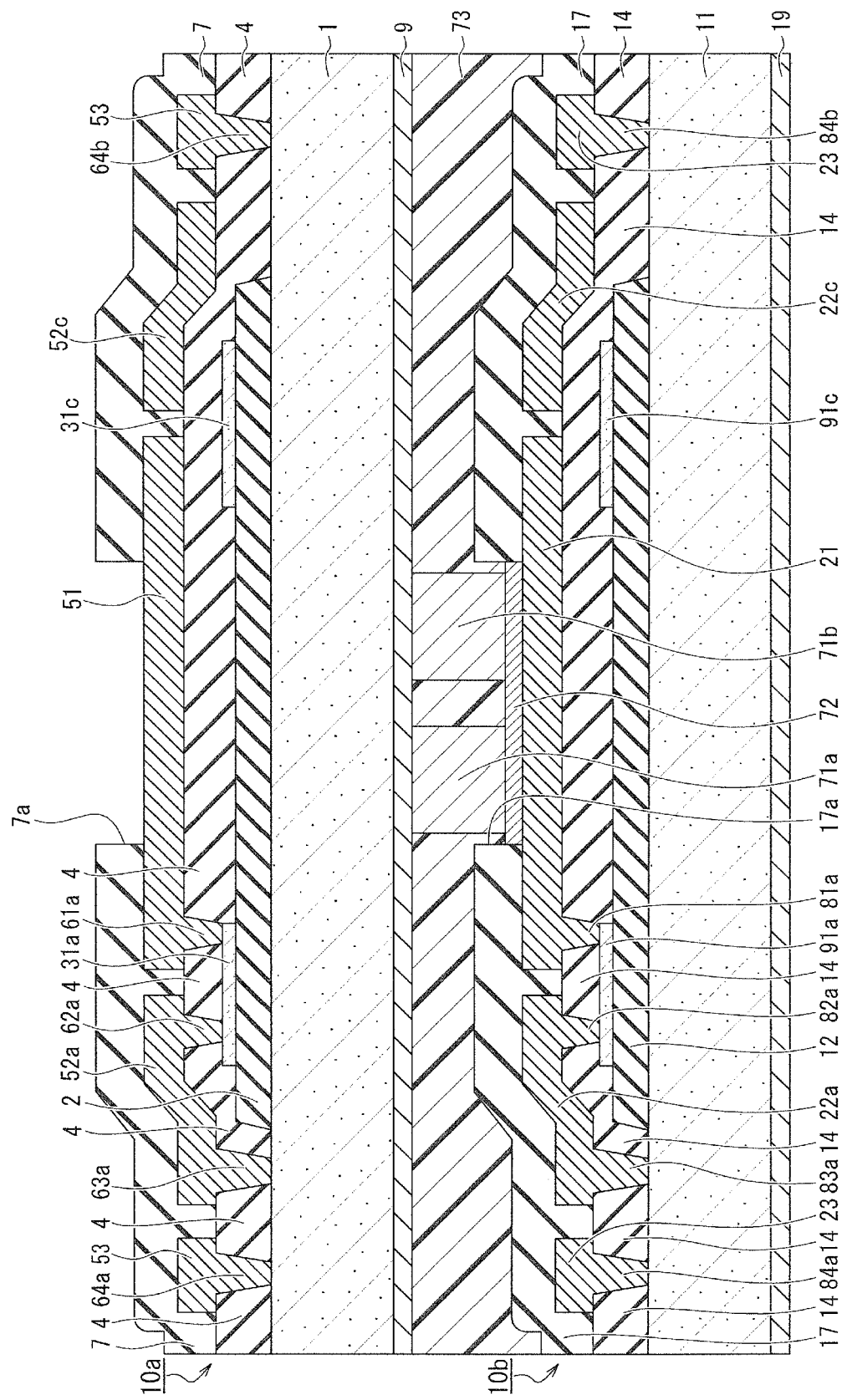
FIG. 12 is a cross-sectional view seen from the direction AA of FIG. 11.

As shown in FIGS. 11 and 12, a resistance element according to a first modification of the embodiment of the present invention differs from the above-described embodiment shown in FIGS. 1-3 in that three resistance layers 31a, 31b, 31d among the four resistance layers 31a to 31d of the upper resistance chip 10a are selectively used and connected in parallel. In the resistance element according to the first modification, the electrode contact area 61c connecting the pad forming electrode 51 and the resistance layer 31c, the wiring contact area 62c connecting the resistance layer 31c and the relay wiring 52c, and the substrate contact area 63c connecting the relay wiring 52c and the semiconductor substrate 1, which are all shown in FIGS. 1 and 2, are not provided.

The lower resistance chip 10b shown in FIG. 12 also has a similar structure to the upper resistance chip 10a of this embodiment, in that the electrode contact area 81c connecting the pad forming electrode 21, the wiring contact area 82c connecting the resistance layer 91c and the relay wiring 22c, and the substrate contact area 83c connecting the relay wiring 22c and the semiconductor substrate 11 are not provided. Since the other configurations of the resistance element of the first modification are the same as those of the resistance elements in the embodiment shown in FIGS. 1 to 3, duplicated descriptions will be omitted.

According to the resistance element of the first modification, the number of parallel connections of the resistance layers 31a, 31b, 31d and the like is reduced as compared with the resistance element according to the embodiment shown in FIGS. 1 to 3. Thus, the resistance value of the resistance element of the modified example can be increased.

Second Modification Example

Figure 13:
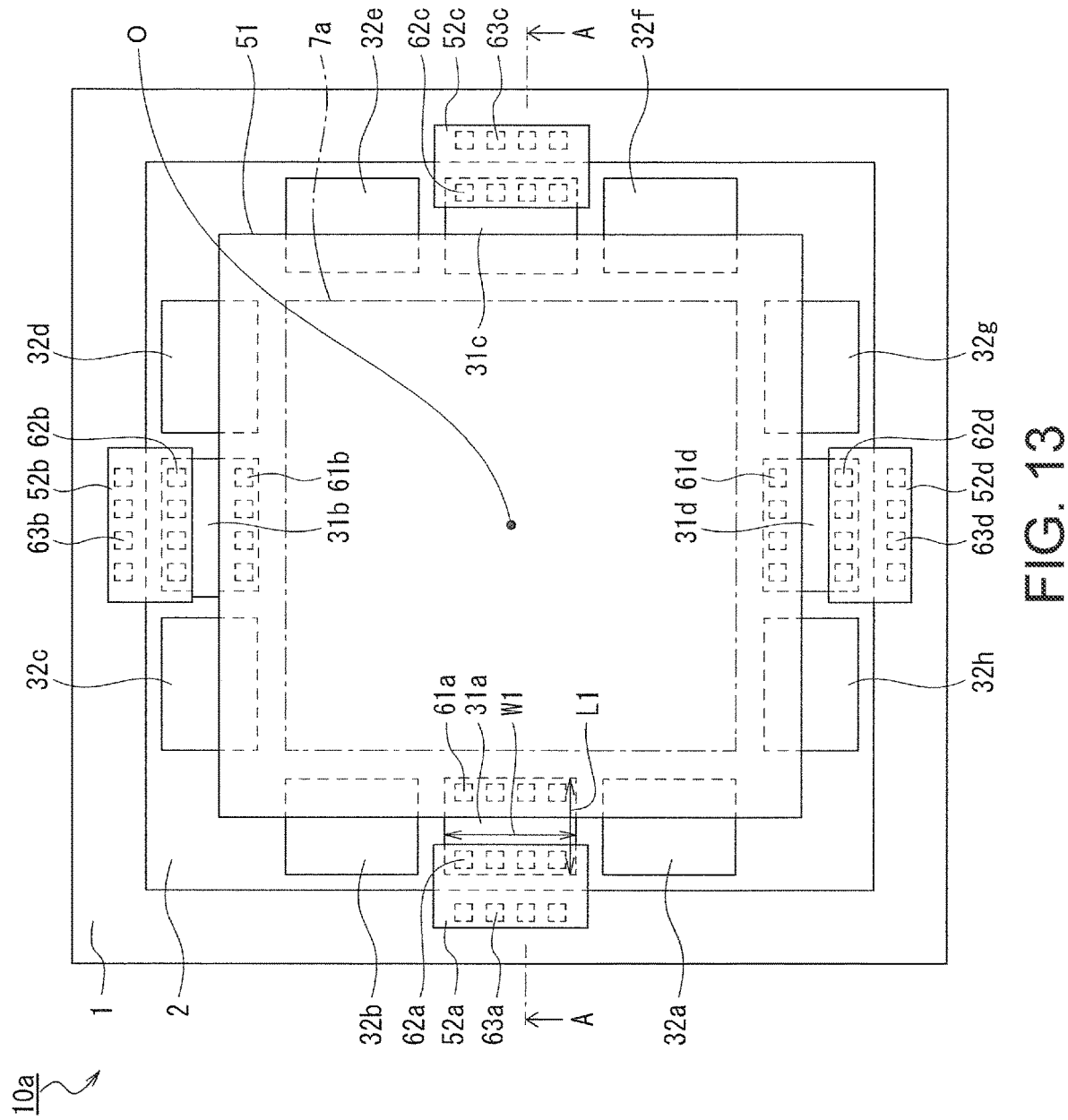
FIG. 13 is a plan view of a resistance element according to a second modification of the embodiment.
Figure 14:
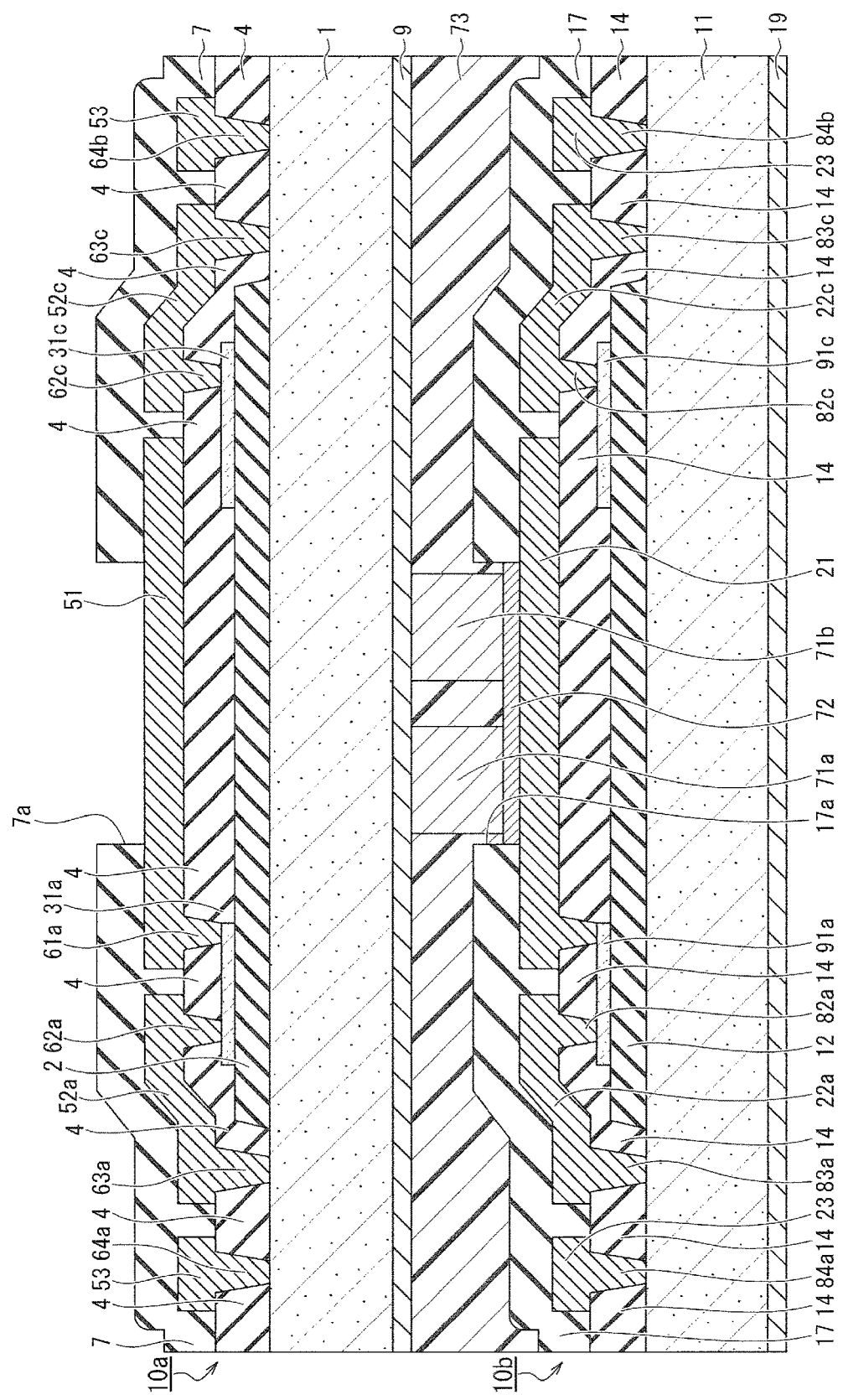
FIG. 14 is a cross-sectional view seen from the direction AA of FIG. 13.

As shown in FIGS. 13 and 14, a resistance element according to a second modification of the embodiment of the present invention is similar to the first modification examples shown in FIGS. 11 and 12 in that three resistance layers 31a, 31b, 31d among the four resistance layers 31a to 31d of the upper resistance chip 10a are selectively connected in parallel. However, in the resistance element according to the second modification, only the electrode contact area 61c connecting the pad forming electrode 51 and the resistance layer 31c shown in FIGS. 1 and 2 is not provided, and the wiring contact area 62c connecting the resistance layer 31c and the relay wiring 52c and the substrate contact area 63c connecting the relay wiring 52c and the semiconductor substrate 1 are both still provided, which is a difference from the resistance element of the first modification shown in FIGS. 11 and 12.

The lower resistance chip 10b shown in FIG. 14 also has a similar structure to the upper resistance chip 10a in that only the electrode contact area 81c connecting the pad forming electrode 21 and the resistance layer 91c shown in FIG. 2 is not provided, but the wiring contact area 82c connecting the resistance layer 21c and the relay wiring 22c and the substrate contact area 83c connecting the relay wiring 22c and the semiconductor substrate 11 are still provided. Since the other configurations of the resistance element according to the second modification are the same as those of the resistance element according to the first modification shown in FIGS. 11 and 12, duplicated descriptions will be omitted.

According to the resistance element of the second modification, the resistance layers 31c and 91c can be omitted even when only the electrode contact areas 61c and 81c are not provided. Here, even if the electrode contact areas 61c and 81c are provided, the resistance layers 31c and 91c can be omitted if the wiring contact areas 62c and 82c or the substrate contact areas 63c and 83c are not provided. That is, the resistance layers 31c and 91c can be eliminated by not providing at least one of the electrode contact areas 61c and 81c, the wiring contact areas 62c and 82c, and the substrate contact areas 63c and 83c.

Third Modification Example

Figure 15:
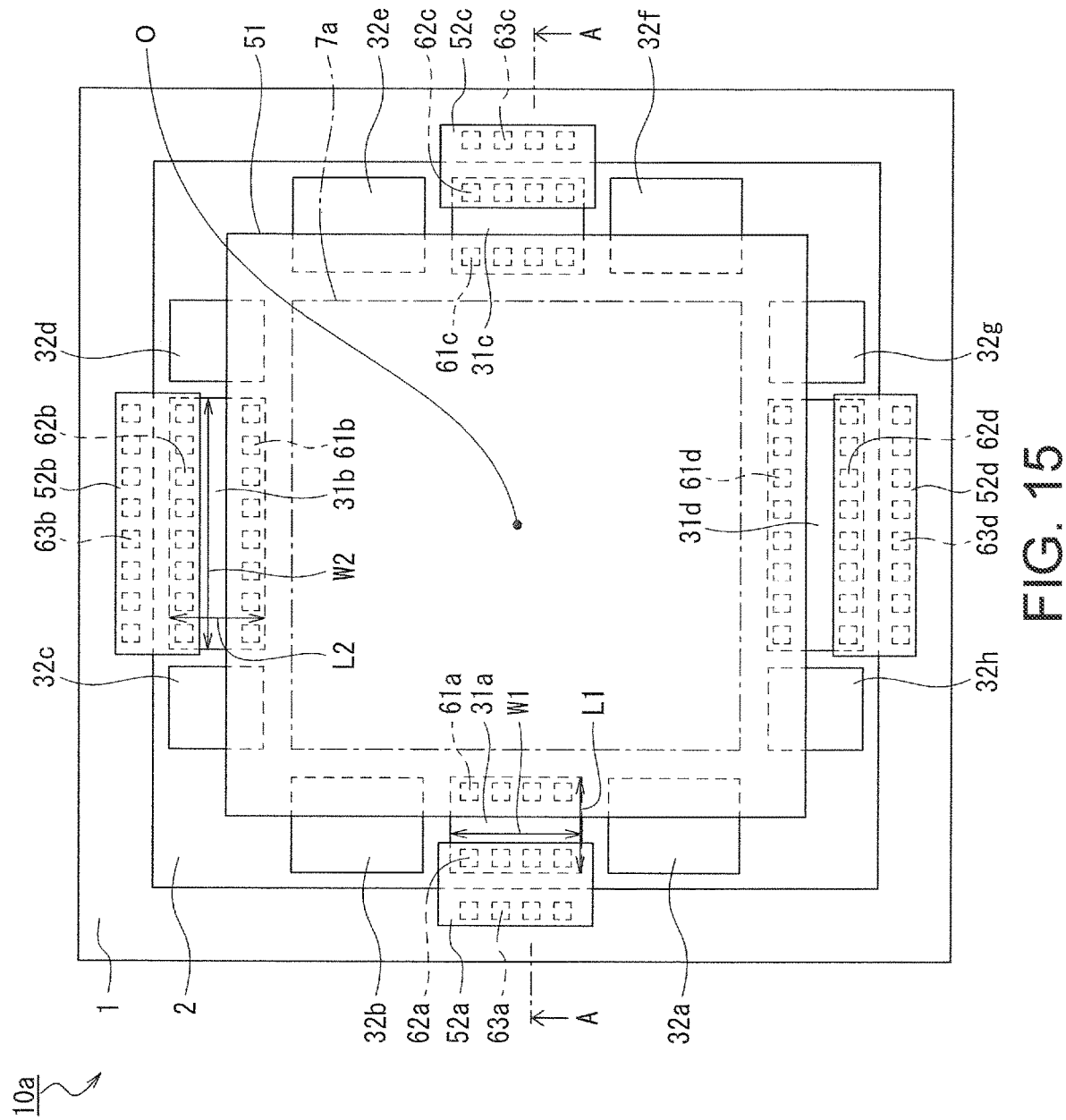
FIG. 15 is a plan view of a resistance element according to a third modification of the embodiment.

As shown in FIG. 15, a resistance element according to a third modification of the embodiment of the present invention differs from the resistance element of the above-described embodiment shown in FIGS. 1-3 in that the width W1 of the resistance layers 31a and 31c of the upper resistance chip 10a is different from the width W2 of the resistance layers 31b and 31d Since the width W1 of the resistance layers 31a and 31c is made smaller than the width W2 of the resistance layers 31b and 31d, the resistance value of the resistance layers 31a and 31c is larger than the resistance value of the resistance layers 31b and 31d. Although not shown in FIG. 15, the lower resistance chip 10b stacked on the lower side of the upper resistance chip 10a also has the same structure as the upper resistance chip 10a. Since the other configurations of the resistance element according to the third modification are the same as those of the resistance element according to the embodiment shown in FIGS. 1 to 3, duplicated descriptions will be omitted.

According to the resistance element of the third modification, the resistance value of the resistance layers 31a and 31c is made different from that of the resistance layer 31b and 31d by making the width W1 of the resistance layers 31a and 31c different from the width W2 of the resistance layers 31b and 31d. Therefore, when the resistance layers 31a to 31d are selectively used, the degree of freedom of the overall resistance value of the resistance element is increased in this third modification. In the resistance element according to the third modification, the case where the resistance value of the two resistance layers 31a and 31c differs from the resistance value of the two resistance layers 31b and 31d has been exemplified, but the present invention is not limited to this. For example, the resistance values of all of the four resistance layers 31a to 31d may be different from each other by making the respective widths of the four resistance layers 31a to 31d different from each other.

Fourth Modification

Figure 16:
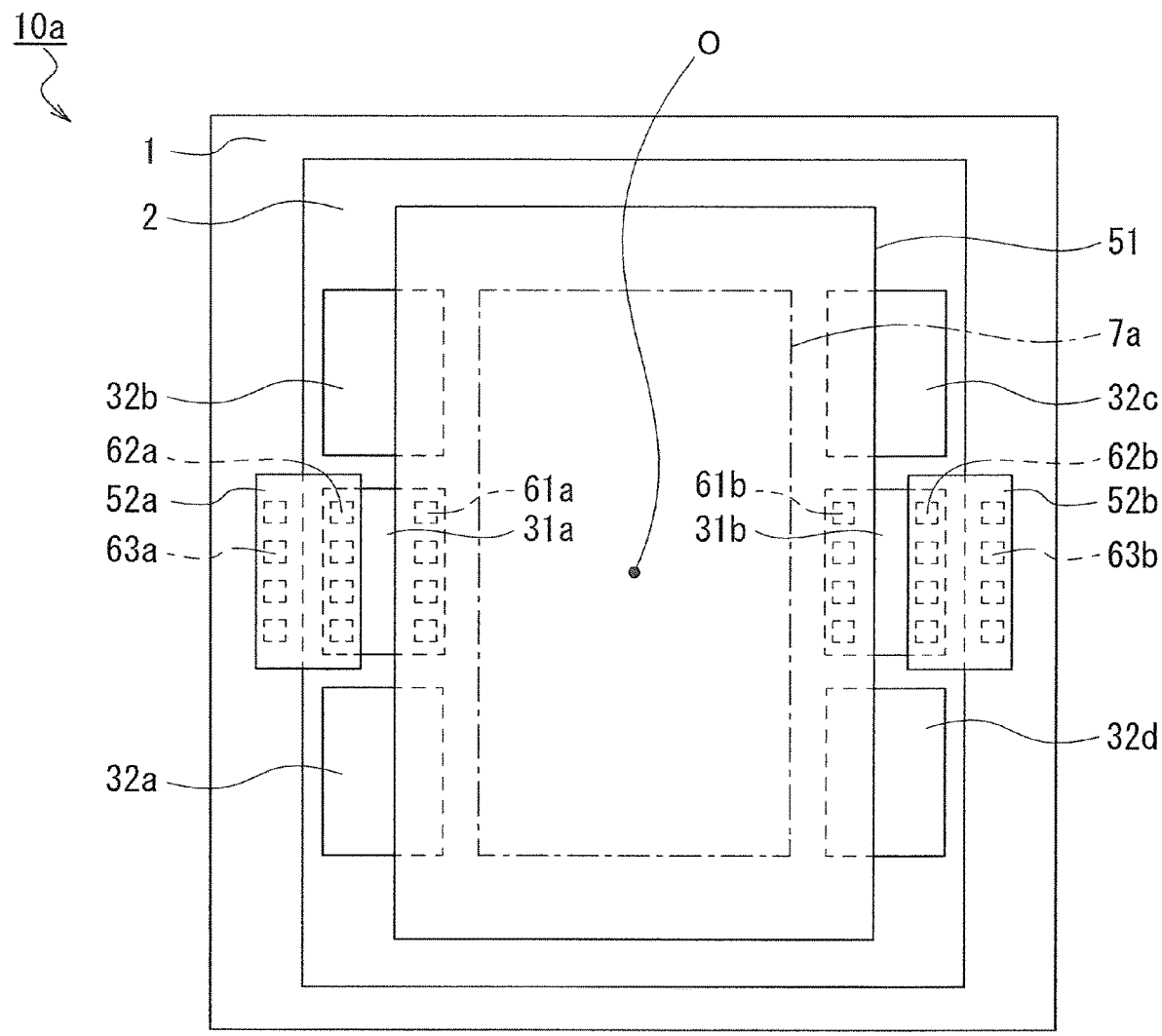
FIG. 16 is a plan view of a resistance element according to a fourth modification of the embodiment.

As shown in FIG. 16, a resistance element according to a fourth modification of the embodiment of the present invention differs from the resistance element of the above-described embodiment shown in FIGS. 1-3 in that two resistance layers 31a and 31b of the upper resistance chip 10a are provided so as to face each other and sandwich the pad forming electrode 51. Since the planar patterns of the resistance layers 31a and 31b, the pad forming electrodes 51, and the relay wirings 52a and 52b are 180 degree rotationally symmetric with respect to the center O of the chip, the resistance element of this modification example can be mounted with a 180° rotation. Thus, the assembly work becomes easy. Here, although not shown in FIG. 16, the lower resistance chip 10b stacked on the lower side of the upper resistance chip 10a also has the same structure as the upper resistance chip 10a. Since the other configurations of the resistance element according to the fourth modification are the same as those of the resistance element according to the embodiment shown in FIGS. 1 to 3, duplicated descriptions will be omitted.

According to the resistance element of the fourth modification, even when the two resistance layers 31a and 31b are provided, by selectively deciding on the presence or absence of the electrode contact areas 61a and 61b, the wiring contact areas 62a and 62b and the substrate contact areas 63a and 63b, either one of or both of the resistance layers 31a and 31b can be selectively used.

Fifth Modification Example

Figure 17:
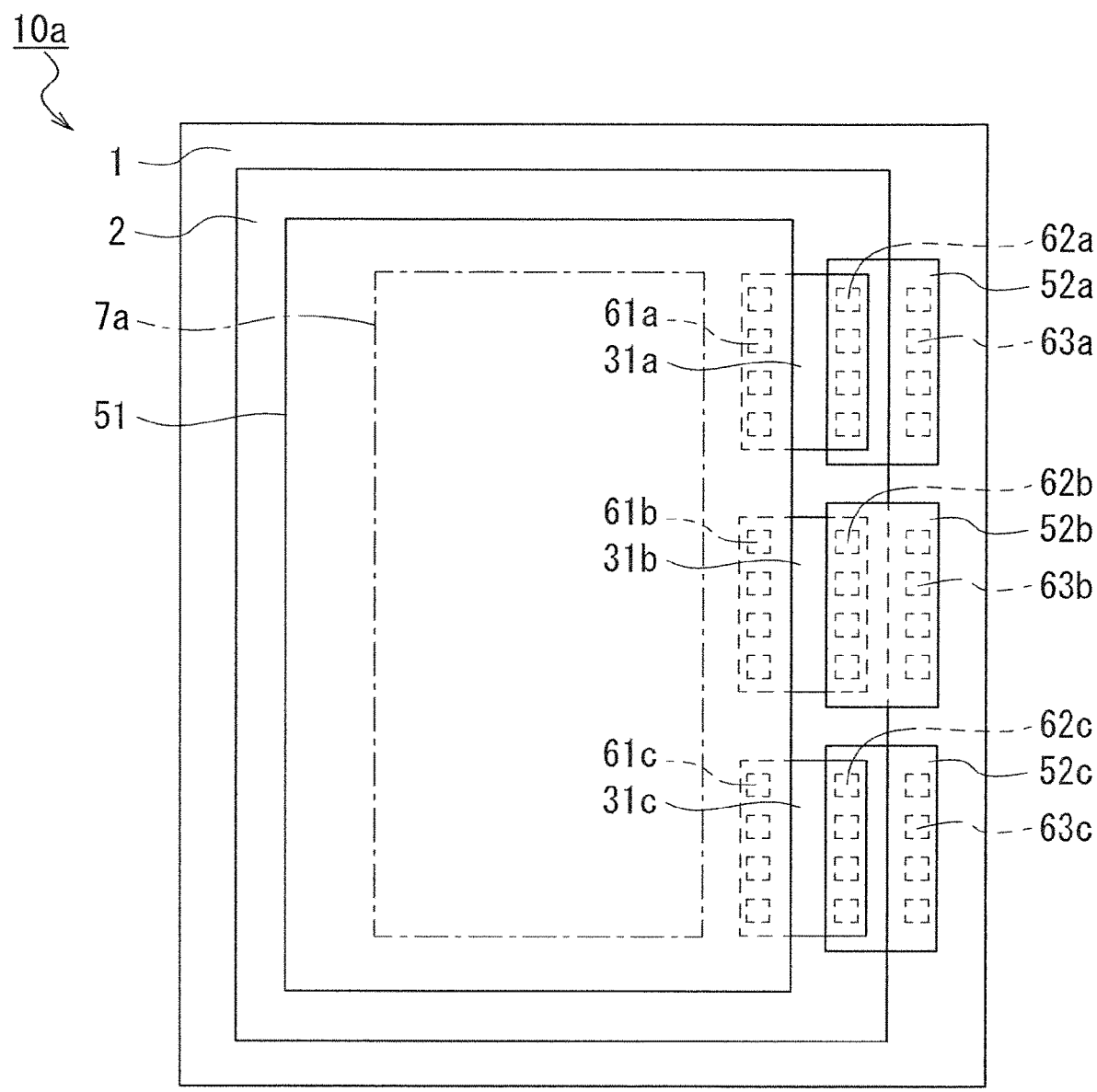
FIG. 17 is a plan view of a resistance element according to a fifth modification of the embodiment.

As shown in FIG. 17, a resistance element according to a fifth modification of the embodiment of the present invention differs from the resistance element of the above-described embodiment shown in FIGS. 1-3 in that a plurality (three) of resistance layers 31a to 31c are provided on one side of the rectangular planar pattern of the pad forming electrode 51 of the upper resistance chip 10a. Although not shown in FIG. 17, the lower resistance chip 10b stacked on the lower side of the upper resistance chip 10a also has the same structure as the upper resistance chip 10a. Since the other configurations of the resistance element according to the fifth modification are the same as those of the resistance element according to the embodiment shown in FIGS. 1 to 3, duplicated descriptions will be omitted.

According to the resistance element of the fifth modification, even when the three resistance layers 31a to 31c are provided on one side of the rectangular planar pattern of the pad forming electrode 51, by adjusting the presence or absence of the electrode contact areas 61a to 61c, the wiring contact areas 62a to 62c, and the substrate contact areas 63a to 63c, one or more, or all of the resistance layers 31a to 31c can be selectively used.

Sixth Modification Example

Figure 18:
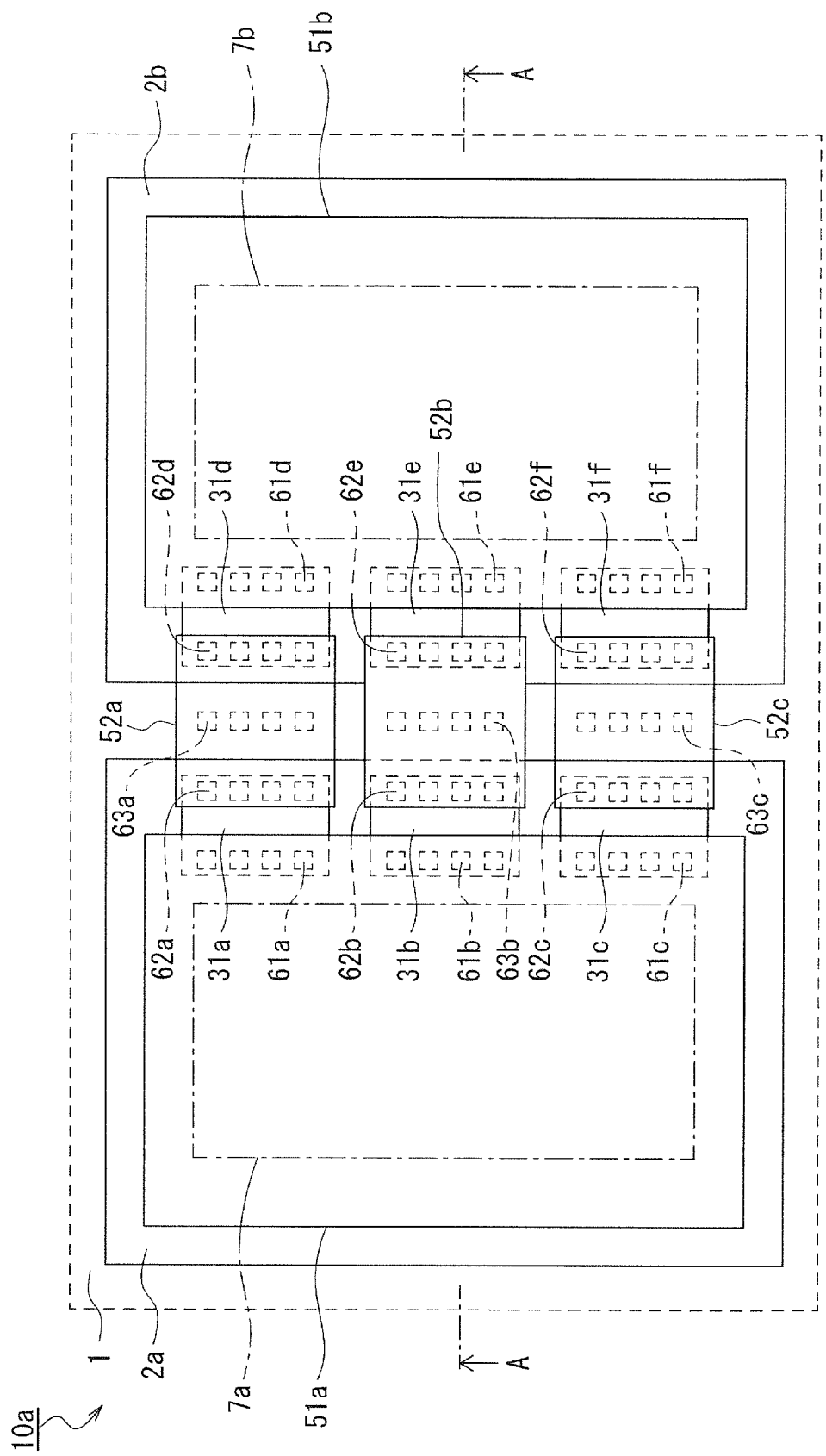
FIG. 18 is a plan view of a resistance element according to a sixth modification of the embodiment.
Figure 19:
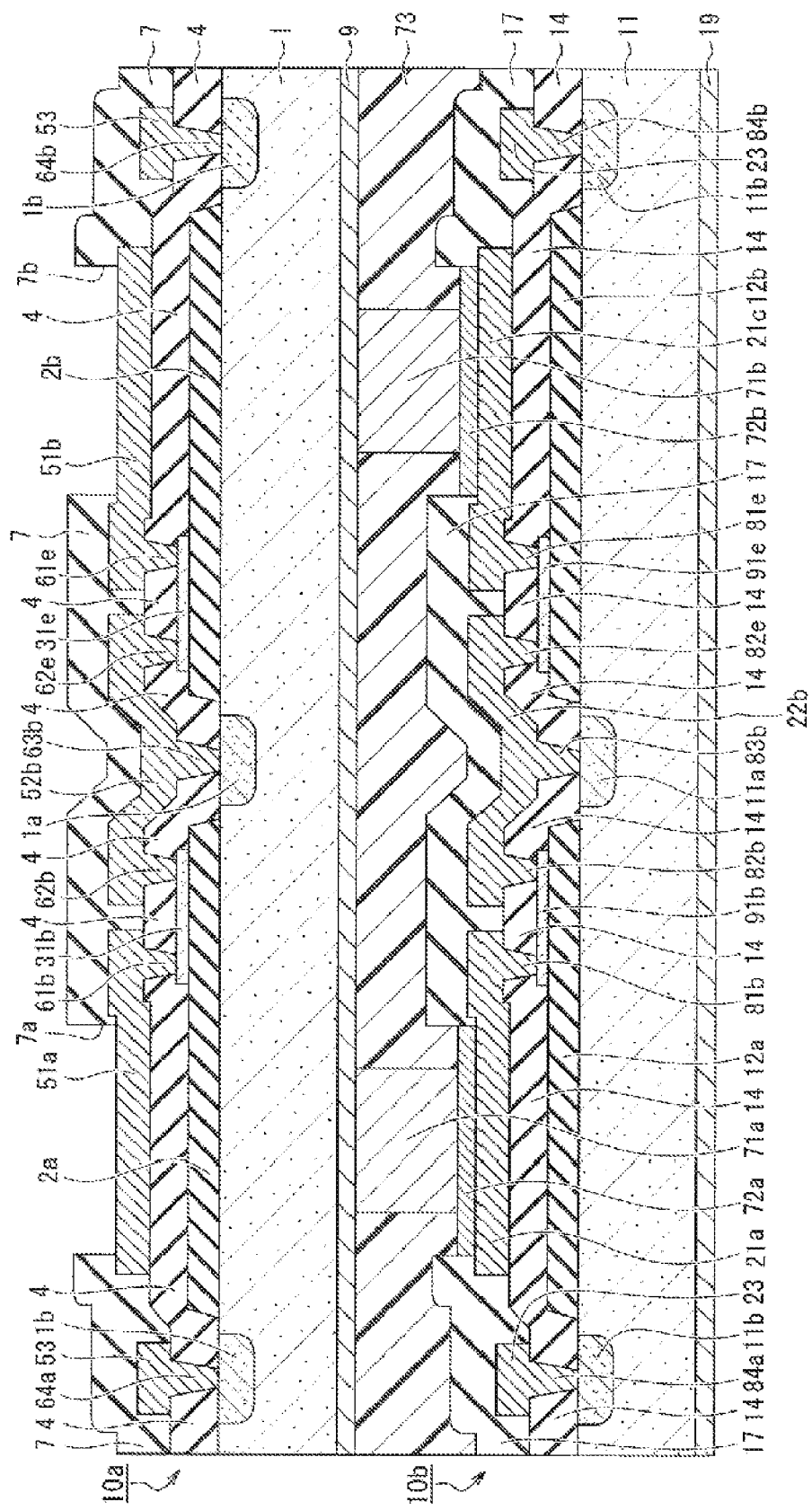
FIG. 19 is a cross-sectional view seen from the direction AA of FIG. 18.

As shown in FIGS. 18 and 19, a resistance element according to a sixth modification of the embodiment of the present invention differs from the resistance element of the above-described embodiment shown in FIGS. 1-3 in that a plurality (two) of pad forming electrodes 51a and 51b are provided to be separated from each other and resistance layers 31a to 31f are provided between the pad forming electrodes 51a and 51b in the upper resistance chip 10a.

One end side of the resistance layers 31a to 31c is connected to the pad forming electrode 51a via the electrode contact areas 61a to 61c. Relay wirings 52a to 52c are connected to the other ends of the resistance layers 31a to 31c via wiring contact areas 62a to 62c. One end side of the resistance layers 31d to 31f is connected to the pad forming electrode 51b via the electrode contact areas 61d to 61f. Relay wirings 52a to 52c are connected to the other ends of the resistance layers 31d to 31f via wiring contact areas 62d to 62f.

The relay wirings 52a to 52c are connected to the semiconductor substrate 1 via the substrate contact areas 63a to 63c. In the upper part of the semiconductor substrate 1, which is the contact point between the substrate contact areas 63a to 63c and the semiconductor substrate 1, the contact region 1a having the same conductive type as the semiconductor substrate 1 and having a higher impurity concentration (low resistivity) than the semiconductor substrate 1 is provided. Peripheral contact areas 1b having a higher impurity concentration is also provided at the periphery. The contact area 1a and the peripheral contact areas 1b may also be provided in the other modification examples of the embodiment.

The lower resistance chip 10b shown in FIG. 19 also has the same structure as the upper resistance chip 10a. That is, in the lower resistance chip 10b, a plurality (two) of pad forming electrodes 21a and 21b are provided apart from each other, and resistance layers 91b and 91e are provided between the pad forming electrodes 51a and 51b. One end side of the resistance layer 91b is connected to the pad forming electrode 21a via the electrode contact area 81b. A relay wiring 22b is connected to the other end side of the resistance layer 91b via a wiring contact area 82b. One end side of the resistance layer 91e is connected to the pad forming electrode 21b via the electrode contact area 81e. A relay wiring 22b is connected to the other end side of the resistance layer 91e via a wiring contact area 82e.

The relay wiring 22b is connected to the semiconductor substrate 11 via the substrate contact area 83b. A contact region 11a, which is a contact point between the substrate contact areas 83a to 83c and the semiconductor substrate 1, and a peripheral contact region 11b are provided on the upper portion of the semiconductor substrate 11. Plating layers 72a and 72b are arranged on the pad forming electrodes 21a and 21b, respectively. The plating layers 72a and 72b are bonded to the back surface electrode 9 of the upper resistance chip 10a by the bonding layers 71a and 71b.

The resistance element according to the sixth modification can be applied to, for example, the pair of gate resistors R1 and R2 in FIG. 6. Since the other configurations of the resistance element according to the sixth modification are the same as those of the resistance element according to the embodiment shown in FIGS. 1 to 3, duplicated descriptions will be omitted.

According to the resistance element of the sixth modification, even when a plurality (two) of pad forming electrodes 51a, 51b and the like are provided, by adjusting the presence or absence of the electrode contact areas 61a to 61f, the wiring contact areas 62a to 62f, and the substrate contact area 63a to 63f, a part or all of the resistance layers 31a to 31f and the like can be selectively used.

Seventh Modification Example

Figure 20:
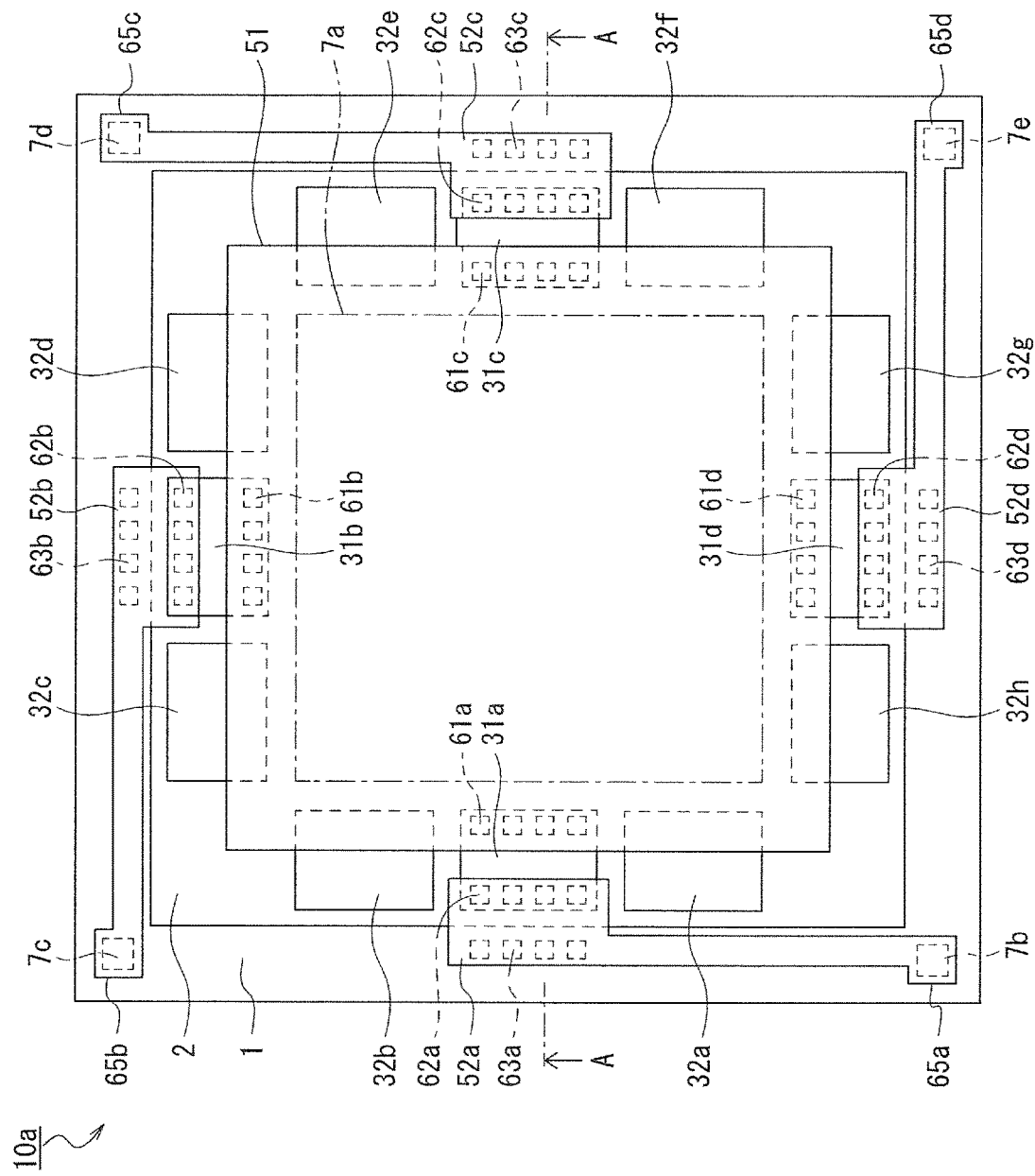
FIG. 20 is a plan view of a resistance element according to a seventh modification of the embodiment.

As shown in FIG. 20, a resistance element according to a seventh modification of the embodiment of the present invention differs from the resistance element of the above-described embodiment shown in FIGS. 1-3 in that auxiliary pads 65a to 65d are provided and are electrically connected to the relay wirings 63a to 63d, respectively, of the upper resistance chip 10a. In FIG. 20, the protective insulating film is not shown, and only the openings 7b to 7e of the protective insulating film are shown by broken lines. The auxiliary pads 65a to 65d are exposed from the openings 7b to 7e of the protective insulating film. The auxiliary pads 65a to 65d are made of the same material as the relay wirings 63a to 63d, and can be formed at the same time when the relay wirings 63a to 63d are formed. Although not shown in FIG. 20, the lower resistance chip 10b stacked on the lower side of the upper resistance chip 10a also has the same structure as the upper resistance chip 10a. Since the other configurations of the resistance element according to the seventh modification are the same as those of the resistance element according to the embodiment shown in FIGS. 1 to 3, duplicated description will be omitted.

Figure 21:
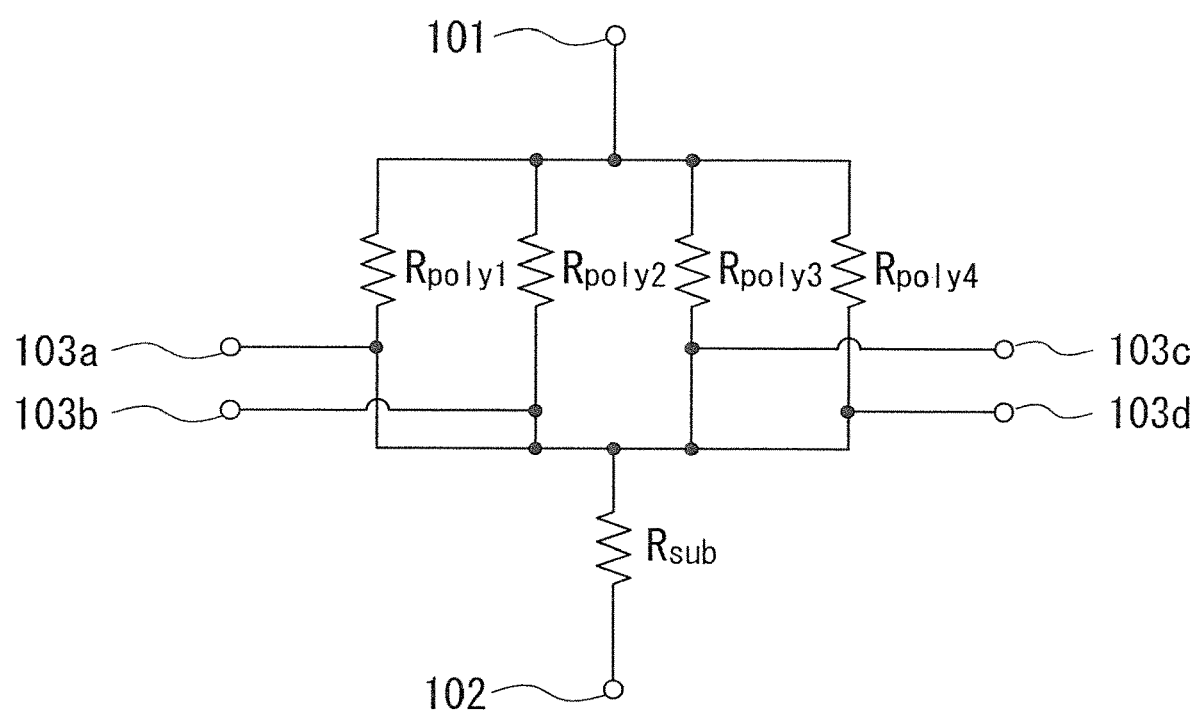
FIG. 21 is an equivalent circuit diagram of the resistance element according to the seventh modification of the embodiment.

FIG. 21 shows an equivalent circuit of the upper resistance chip 10a. In FIG. 21, the pad forming electrode 51 corresponds to the pad side terminal 101, the back surface electrode 9 corresponds to the back surface side terminal 102, and the auxiliary pads 65a to 65d correspond to the auxiliary terminals 103a to 103d, respectively. Between the pad side terminal 101 and the back surface side terminal 102, the resistances $R_{poly1}$ to $R_{poly4}$ connected in parallel corresponding to the resistance layers 31a to 31d and the resistance $R_{sub}$ of the semiconductor substrate 1 are connected in series. The auxiliary terminals 103a to 103d are connected between the resistors $R_{poly1}$ to $R_{poly4}$ corresponding to the resistance layers 31a to 31d and the resistors $R_{sub}$ of the semiconductor substrate 1, respectively.

According to the resistance element of the seventh modification, by arranging the auxiliary pads 65a to 65d, the electrical characteristics of the resistors $R_{poly1}$ to $R_{poly4}$ corresponding to the resistance layers 31a to 31d, which exclude the component of the resistance $R_{sub}$ of the semiconductor substrate 1, can be measured between the pad forming electrode 51 and the auxiliary pads 65a to 65d.

Eight Modification Example

Figure 22:
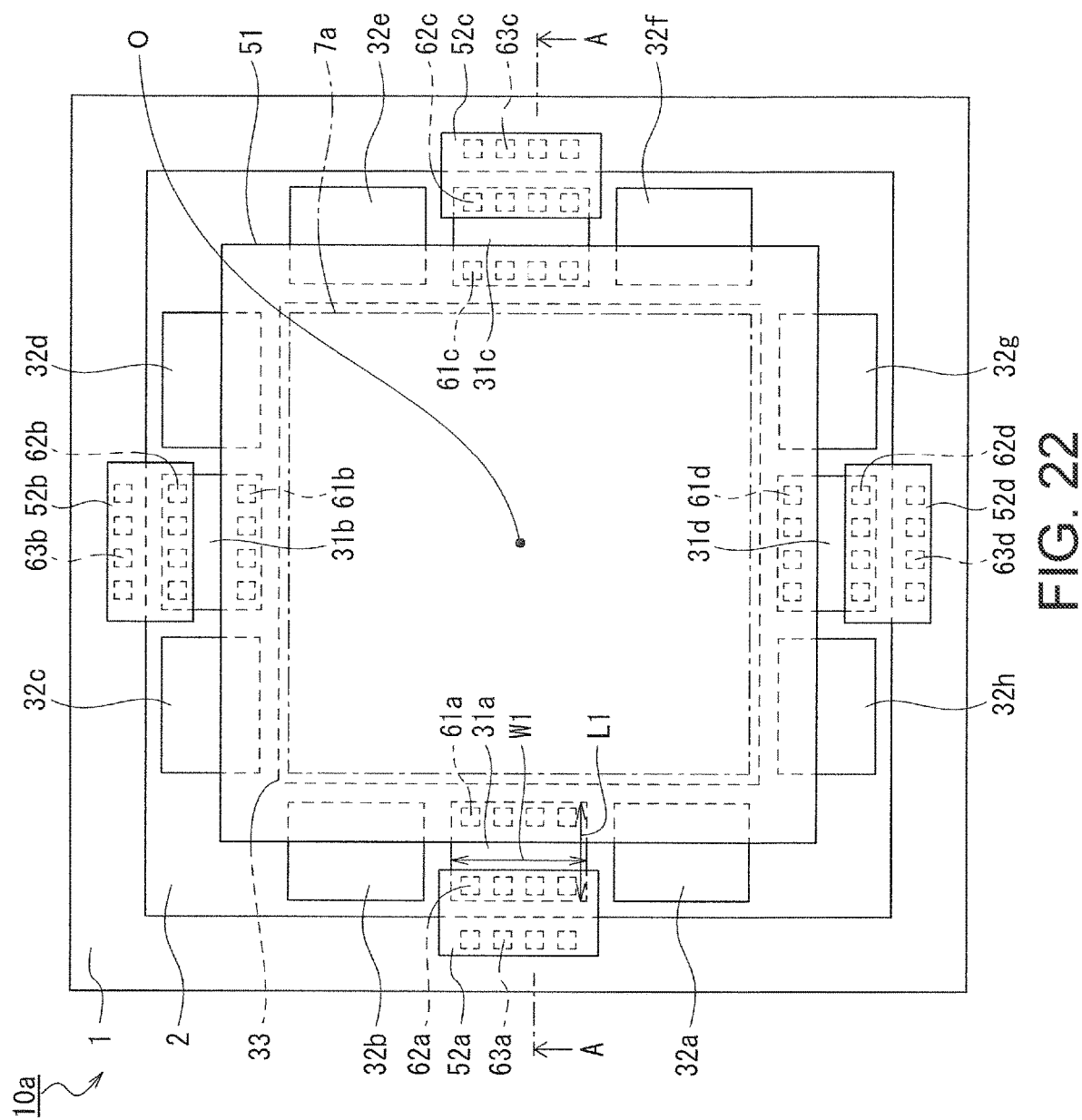
FIG. 22 is a plan view of a resistance element according to an eighth modification of the embodiment.
Figure 23:
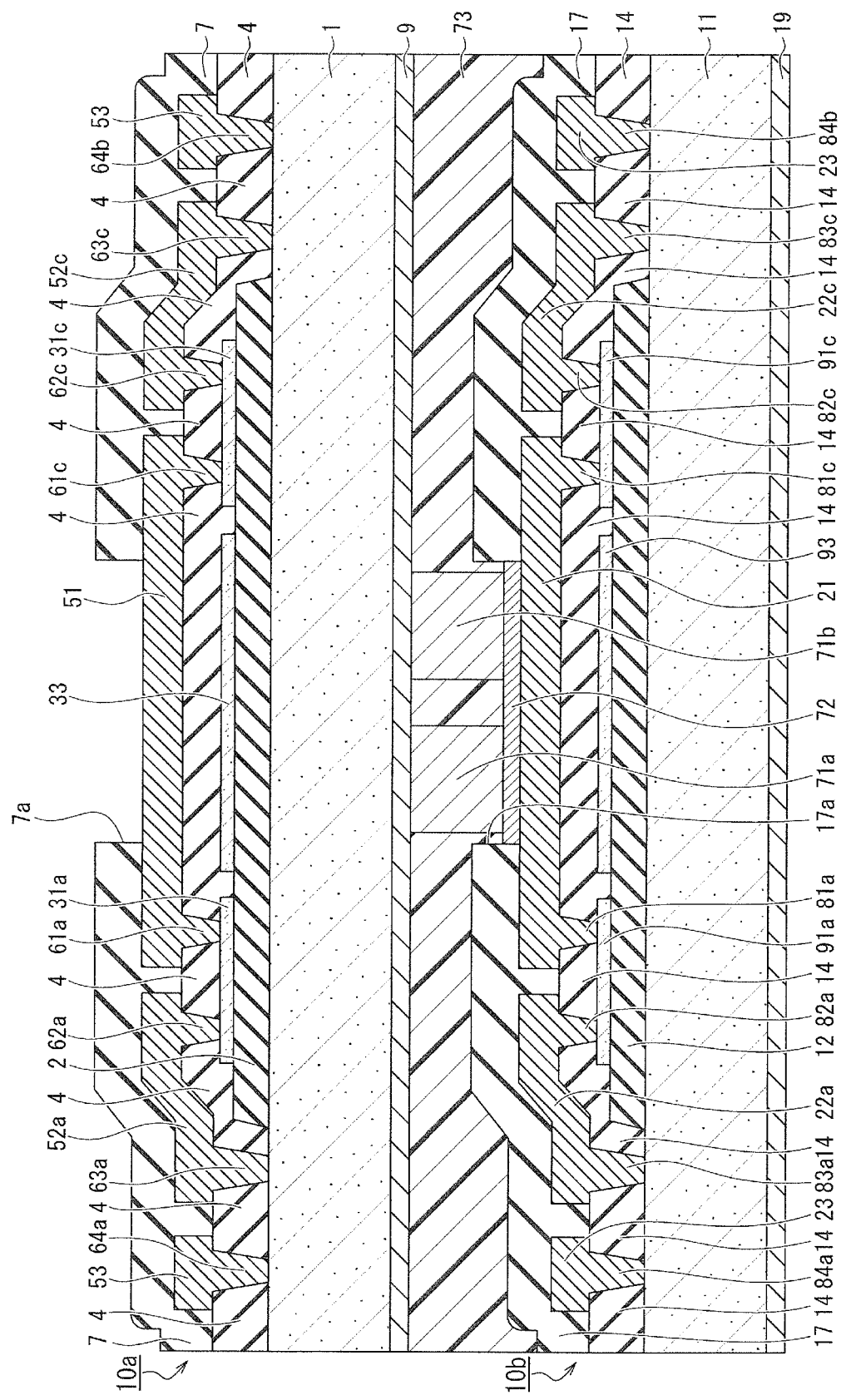
FIG. 23 is a cross-sectional view seen from the direction AA of FIG. 22.

As shown in FIGS. 22 and 23, a resistance element according to an eighth modification of the embodiment of the present invention differs from the resistance element of the above-described embodiment shown in FIGS. 1-3 in that an auxiliary film 33 is disposed on the field insulating film 2 of the upper resistance chip 10a so as to be electrically separated from the resistance layers 31a to 31d (in a floating state).

The auxiliary film 33 is arranged at a position below the pad forming electrode 51 so as to be separated from the resistance layers 31a to 31d. The auxiliary film 33 is made of the same material as the resistance layers 31a to 31d such as n-type DOPOS, and has the same thickness as the resistance layers 31a to 31d. The auxiliary film 33 has, for example, a rectangular planar pattern.

The lower resistance chip 10b shown in FIG. 23 has the same structure as the upper resistance chip 10a. In the cross section shown in FIG. 23, an auxiliary film 93 is arranged on the field insulating film 12 of the lower resistance chip 10b so as to be electrically separated from the resistance layers 91a, 91c (in a floating state). Since the other configurations of the resistance element according to the eighth modification are the same as those of the resistance element according to the embodiment shown in FIG. 1, duplicated descriptions will be omitted.

According to the resistance element of the eighth modification, by arranging the auxiliary films 33 and 93 that are electrically floated on the field insulating films 2 and 12, respectively, similar to the case where the thickness of the field insulating films 2 and 12 is increased, the parasitic capacitances below the pad forming electrodes 21 and 51 can be reduced. As a result, it is possible to suppress the reduction of the total resistance due to the decrease in impedance during high frequency operation, thereby suppressing the oscillation phenomenon.

Ninth Modification Example

Figure 24:
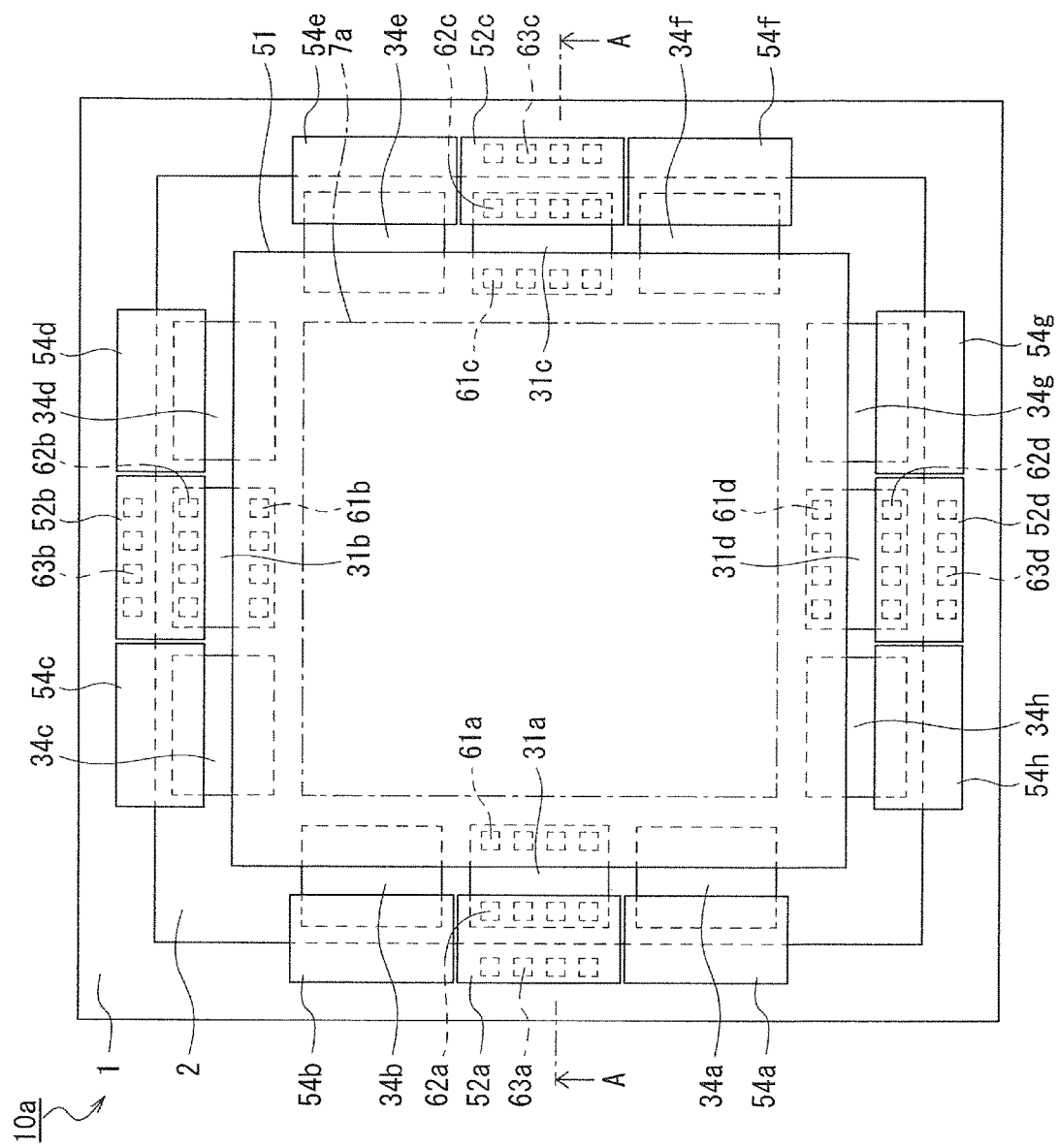
FIG. 24 is a plan view of a resistance element according to a ninth modification of the embodiment.

As shown in FIG. 24, a resistance element according to a ninth modification of the embodiment of the present invention differs from the resistance element of the above-described embodiment shown in FIGS. 1-3 in that resistance layers 34a to 34h of the upper resistance chip 10a as well as relay wirings 54a to 54h are additionally provided in the upper resistance chip 10a. The resistance layers 34a and 34b are arranged so as to sandwich the resistance layer 31a. The resistance layers 34c and 34d are arranged so as to sandwich the resistance layer 31b. The resistance layers 34e and 34f are arranged so as to sandwich the resistance layer 31c. The resistance layers 34g and 34h are arranged so as to sandwich the resistance layer 31d.

The relay wirings 54a and 54b are arranged so as to sandwich the relay wiring 52a. The relay wiring 54c and the relay wiring 54d are arranged so as to sandwich the relay wiring 52b. The relay wiring 54e and the relay wiring 54f are arranged so as to sandwich the relay wiring 52c. The relay wirings 54g and 54h are arranged so as to sandwich the relay wiring 52d. Although not shown in FIG. 24, the lower resistance chip 10b stacked on the lower side of the upper resistance chip 10a also has the same structure as the upper resistance chip 10a. Since the other configurations of the resistance element according to the ninth modification are the same as those of the resistance element according to the embodiment shown in FIGS. 1 to 3, duplicated descriptions will be omitted.

According to the resistance element of the ninth modification, by changing the presence or absence of the electrode contact area, the wiring contact area, and the substrate contact area for connecting the resistance layers 34a to 34h in parallel, the number of parallel connections of the resistance layers 34a to 34h can be increased or decreased along with the number of parallel connections for the resistance layers 31a to 31d. Thus, the overall resistance value of the resistance element according to the ninth modification can be finely adjusted. The number and arrangement positions of the resistance layers are not limited to this example, and can be appropriately set.

Tenth Modification Example

Figure 25:
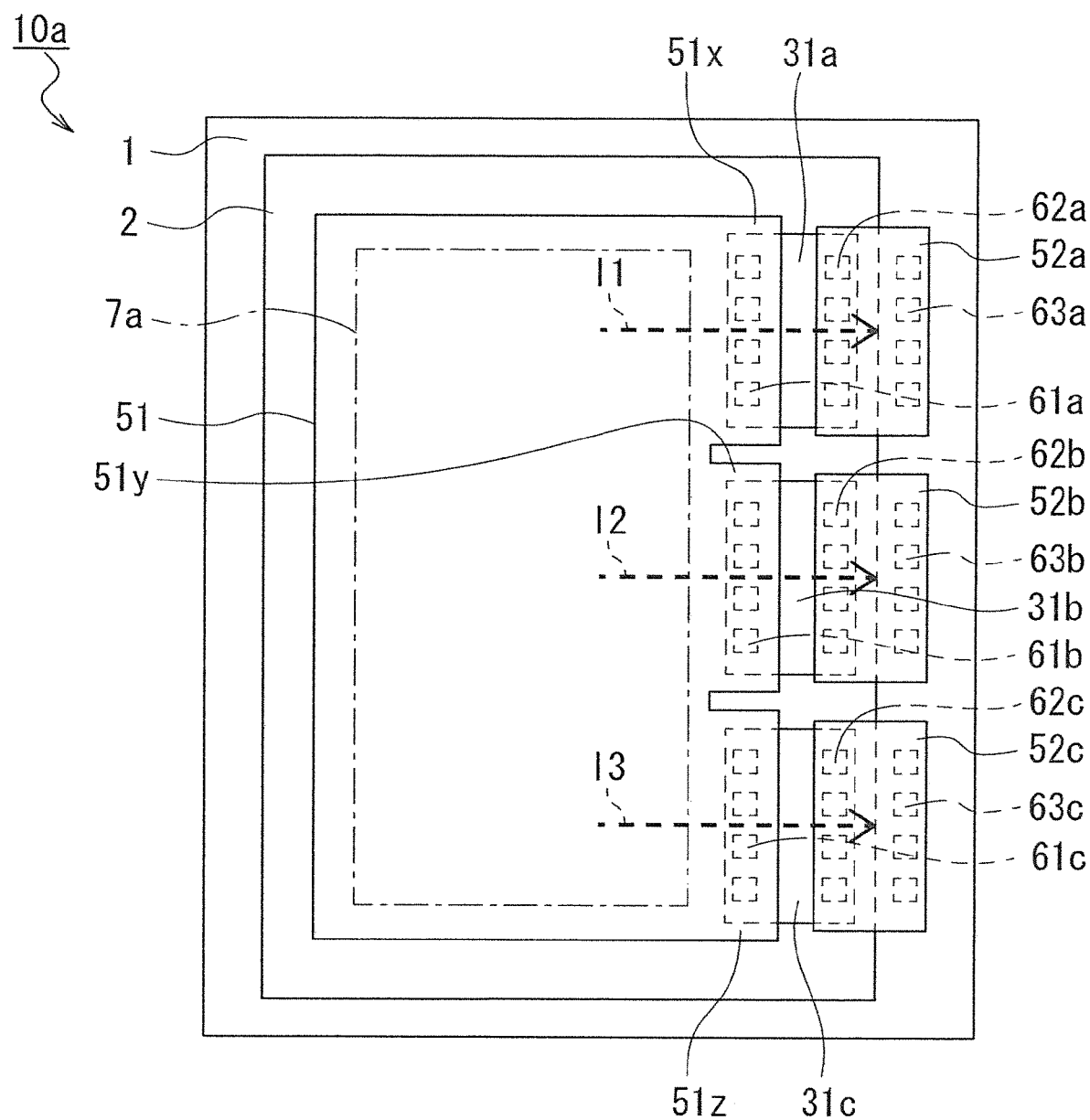
FIG. 25 is a plan view of a resistance element according to a tenth modification of the embodiment.

As shown in FIG. 25, a resistance element according to a tenth modification of the embodiment of the present invention differs from the resistance element of the above-described embodiment shown in FIGS. 1-3 in that protruding portions 51x to 51z are provided on one side of the rectangular planar pattern of the pad forming electrode 51 of the upper resistance chip 10a. The protruding portions 51x to 51z are connected to one end side of the resistance layers 31a to 31c via the electrode contact areas 61a to 61c, respectively. The other ends of the resistance layers 31a to 31c are connected to the relay wirings 52a to 52c via the wiring contact areas 62a to 62c, respectively. The relay wirings 52a to 52c are connected to the semiconductor substrate 1 via the substrate contact areas 63a to 63c, respectively.

In the resistance element according to the tenth modification, three resistance layers 31a to 31c are connected in parallel. Therefore, as schematically shown by an arrow in FIG. 25, a current flows from the protruding portions 51x to 51z of the pad forming electrode 51 to the semiconductor substrate 1 via the resistance layers 31a to 31c and the relay wiring 52a to 52c through the current paths I1 to I3, respectively. Although not shown in FIG. 25, the lower resistance chip 10b stacked on the lower side of the upper resistance chip 10a also has the same structure as the upper resistance chip 10a. Since the other configurations of the resistance element according to the tenth modification are the same as those of the resistance element according to the embodiment shown in FIGS. 1 to 3, duplicated descriptions will be omitted.

According to the resistance element of the tenth modification, when the three resistance layers 31a to 31c are provided, by adjusting the presence or absence of the electrode contact areas 61a to 61c, the wiring contact areas 62a to 62c, and the substrate contact area 63a to 63c, a part or all of the resistance layers 31a to 31c can be selectively used.

Eleventh Modification Example

Figure 26:
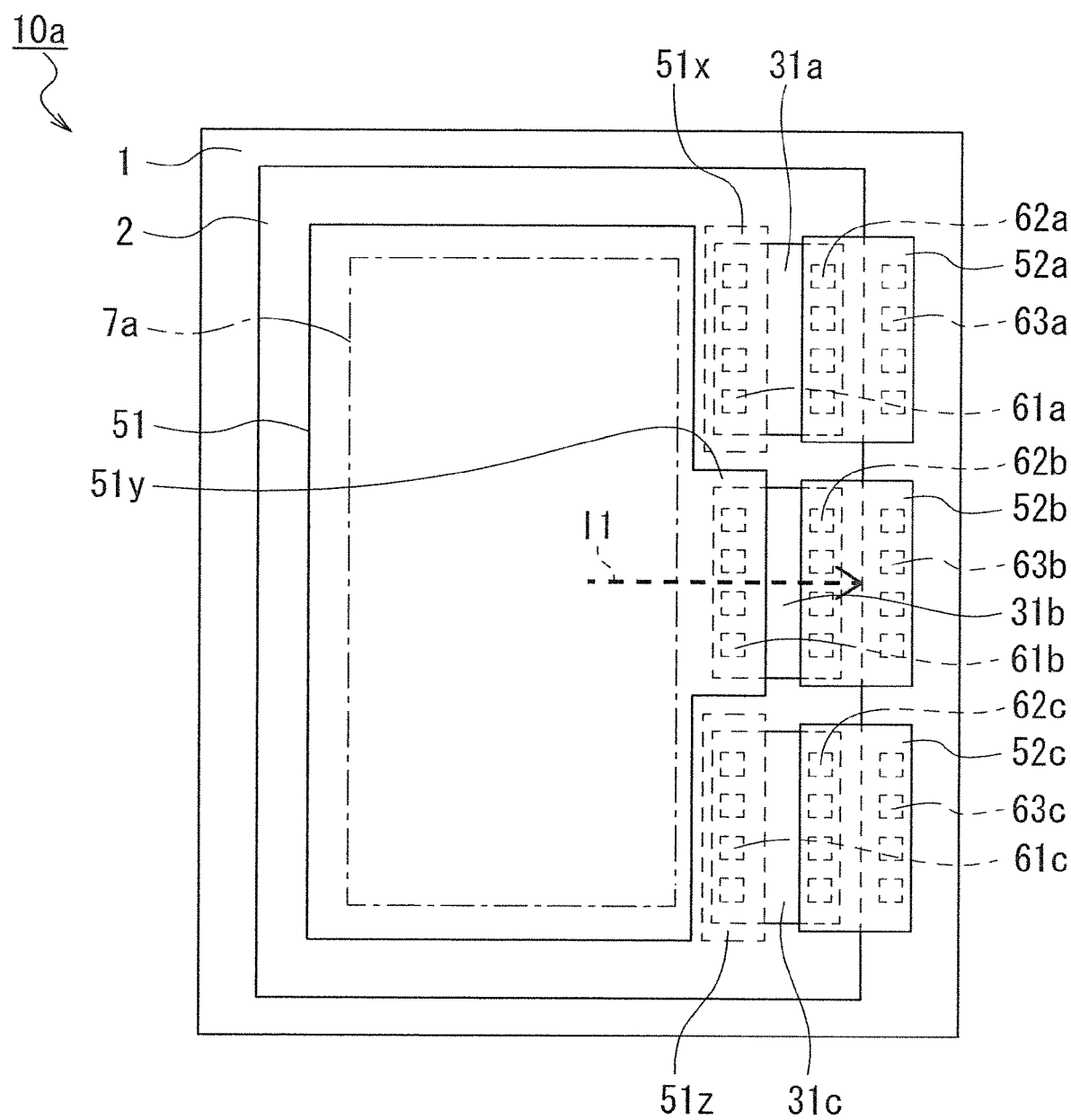
FIG. 26 is a plan view of a resistance element according to an eleventh modification of the embodiment.

As shown in FIG. 26, a resistance element according to an eleventh modification of the embodiment of the present invention differs from the resistance element of the above-described tenth embodiment shown in FIG. 25 in that the protruding portions 51x and 51z are not provided in the pad forming electrode 51 of the upper resistance chip 10a. In the upper resistance chip 10a, a current path I1 in which a current flows from the protruding portion 51y of the pad forming electrode 51 to the semiconductor substrate 1 via the resistance layer 31b and the relay wiring 52b is formed. Although not shown in FIG. 26, the lower resistance chip 10b stacked on the lower side of the upper resistance chip 10a also has the same structure as the upper resistance chip 10a. Since the other configurations of the resistance element according to the eleventh modification are the same as those of the resistance element according to the tenth modification shown in FIG. 25, duplicated descriptions will be omitted.

According to the resistance element of the eleventh modification, by selectively removing some of the protruding portions 51x, 51y, 51z (here, 51x and 51z are removed, and only 51y is kept), a part or all of the resistance layers 31a to 31c can be selectively used (here, only 31b is used) without adjusting the presence or absence of the electrode contact areas 61a to 61c, the wiring contact areas 62a to 62c, and the substrate contact areas 63a to 63c.

Twelfth Modification Example

Figure 27:
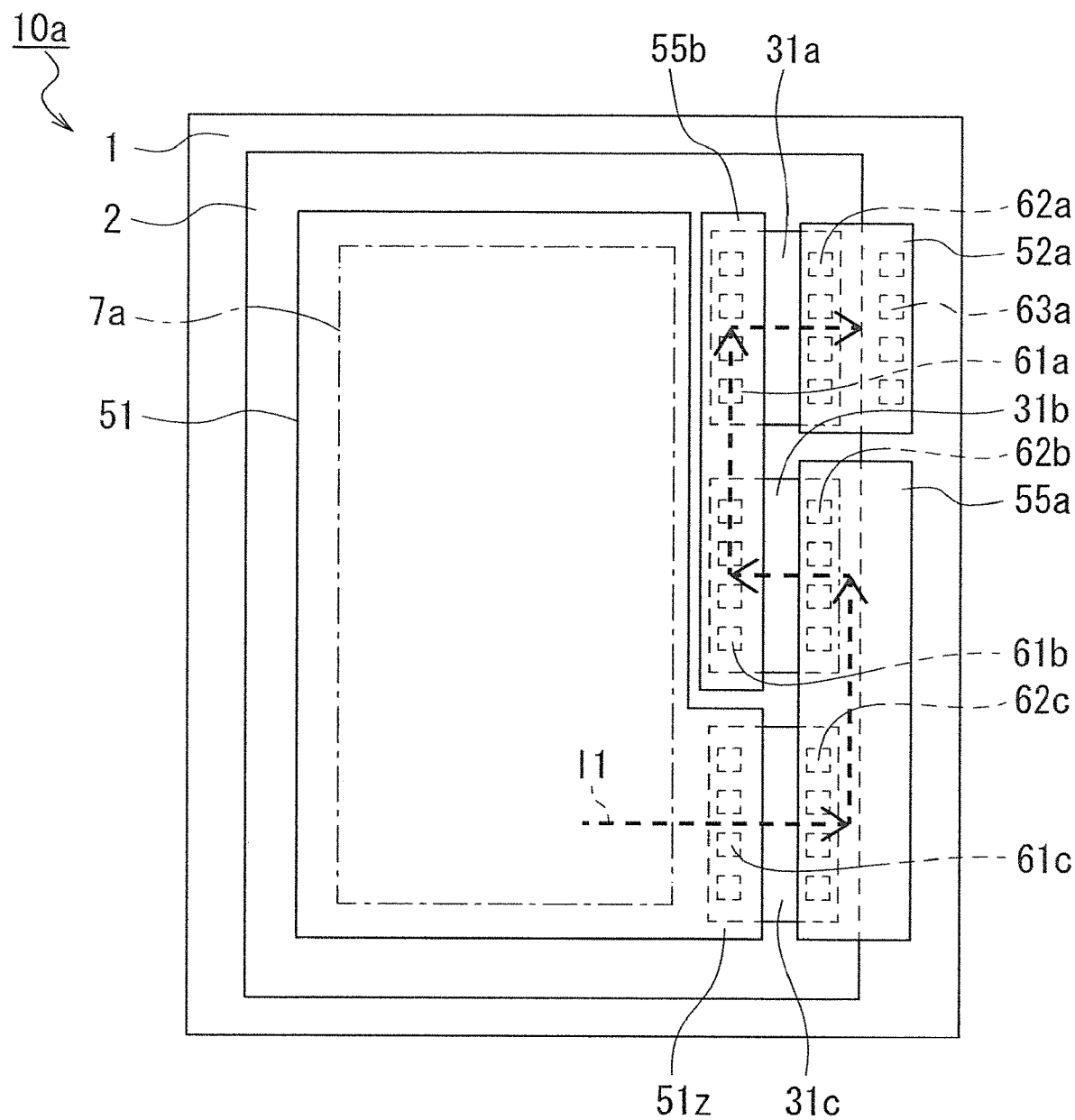
FIG. 27 is a plan view of a resistance element according to a twelfth modification of the embodiment.

As shown in FIG. 27, a resistance element according to a twelfth modification of the embodiment of the present invention differs from the resistance element of the tenth modification shown in FIG. 25 in that a plurality (three) of resistance layers 31a to 31c of the upper resistance chips 10a are connected in series. In the resistance element according to the twelfth modification, inter-resistor wiring 55a is provided at the position where the protruding portion 51x and the protruding portion 51y were arranged in FIG. 25, and inter-resistor wiring 55b is provided at the position where the relay wirings 52b and 52c were arranged in FIG. 25. The inter-resistor wiring 55a is connected to the resistance layers 31b and 31c via the wiring contact areas 62b and 62c. The inter-resistor wiring 55b is connected to the resistance layers 31a and 31b via the electrode contact areas 61a and 61b.

In the resistance element according to the twelfth modification, as schematically shown by an arrow in FIG. 27, there is formed a first current path I1 in which a current flows from the protruding portion 51z of the pad forming electrode 51 to the semiconductor substrate 1 through the resistance layer 31c, the inter-resistor wiring 55a, the resistance layer 31b, the inter-resistor wiring 55b, and the relay wiring 52a. Although not shown in FIG. 27, the lower resistance chip 10b stacked on the lower side of the upper resistance chip 10a also has the same structure as the upper resistance chip 10a. Since the other configurations of the resistance element according to the twelfth modification are the same as those of the resistance element according to the tenth modification shown in FIG. 25, duplicated descriptions will be omitted.

According to the resistance element of the twelfth modification, by arranging the inter-resistor wirings 55a and 55b, a plurality of resistance layers 31a to 31c can be connected in series and the overall resistance value can be increased.

Thirteenth Modification Example

Figure 28:
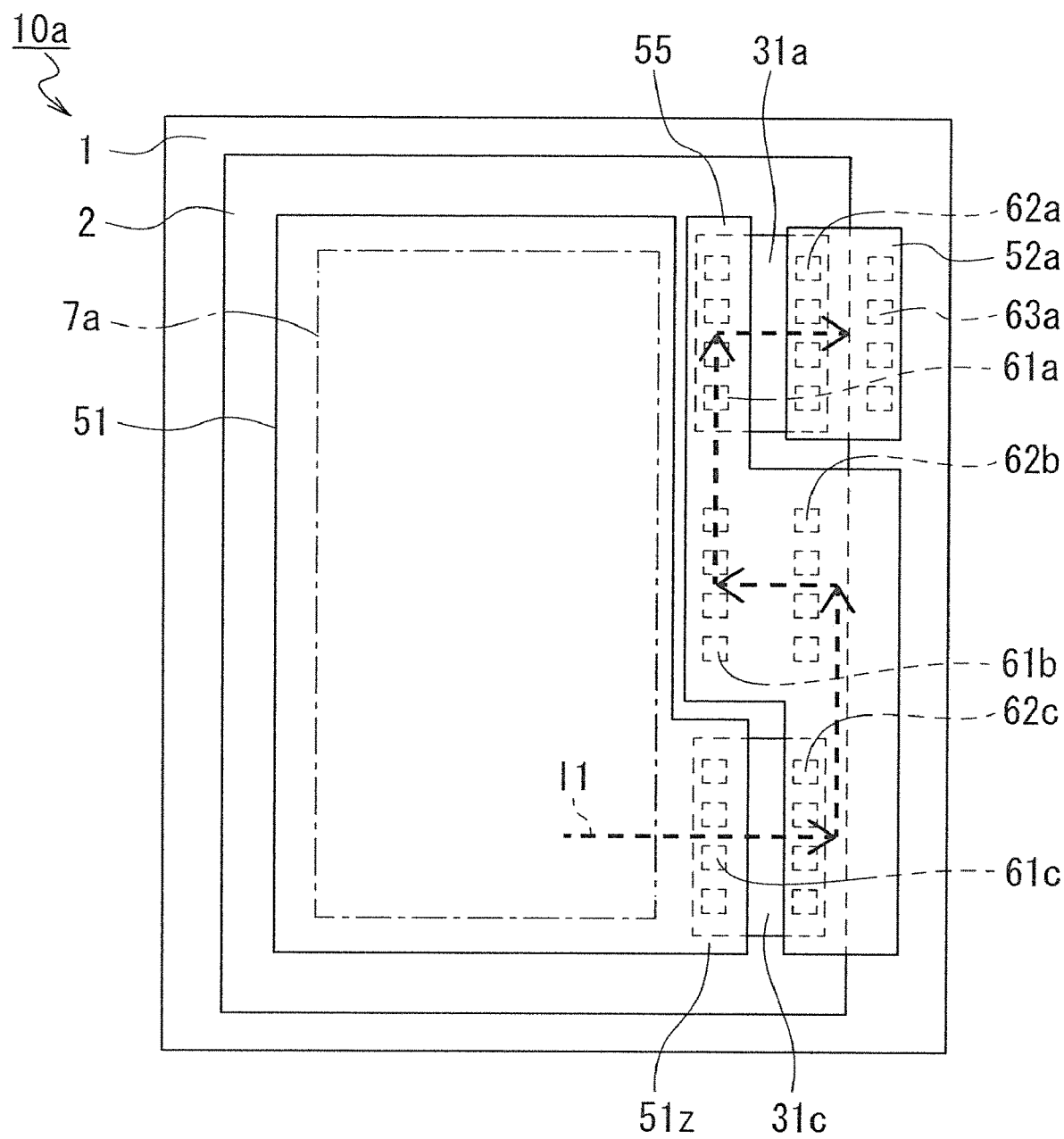
FIG. 28 is a plan view of a resistance element according to a thirteenth modification of the embodiment.

As shown in FIG. 28, a resistance element according to a thirteenth modification of the embodiment of the present invention differs from the resistance element of the tenth modification shown in FIG. 25 in that a plurality (two) of resistance layers 31a and 31c of the upper resistance chips 10a are connected in series. The upper resistance chip 10a is provided with the inter-resistor wiring 55 at a position where the protruding portions 51x, 51y and the relay wirings 52b, 52c were arranged in FIG. 25. The inter-resistor wiring 55 is connected to the resistance layer 31a via the electrode contact area 61a and is connected to the resistance layer 31c via the wiring contact area 62c.

In the resistance element according to the thirteenth modification, as schematically shown by an arrow in FIG. 28, there is provided a current path I1 in which a current flows from the protruding portion 51z of the pad forming electrode 51 to the semiconductor substrate 1 through the resistance layer 31c, the inter-resistor wiring 55, the resistance layer 31a, and the relay wiring 52a. Although not shown in FIG. 28, the lower resistance chip 10b stacked on the lower side of the upper resistance chip 10a also has the same structure as the upper resistance chip 10a. Since the other configurations of the resistance element according to the twelfth modification are the same as those of the resistance element according to the tenth modification shown in FIG. 25, duplicated descriptions will be omitted.

According to the resistance element of the thirteenth modification, by arranging the inter-resistor wiring 55, a plurality of resistance layers 31a and 31c are connected in series while avoiding contact to the substrate in the vicinity of the pad forming electrode 51, and the overall resistance value can be increased.

Fourteenth Modification Example

Figure 29:
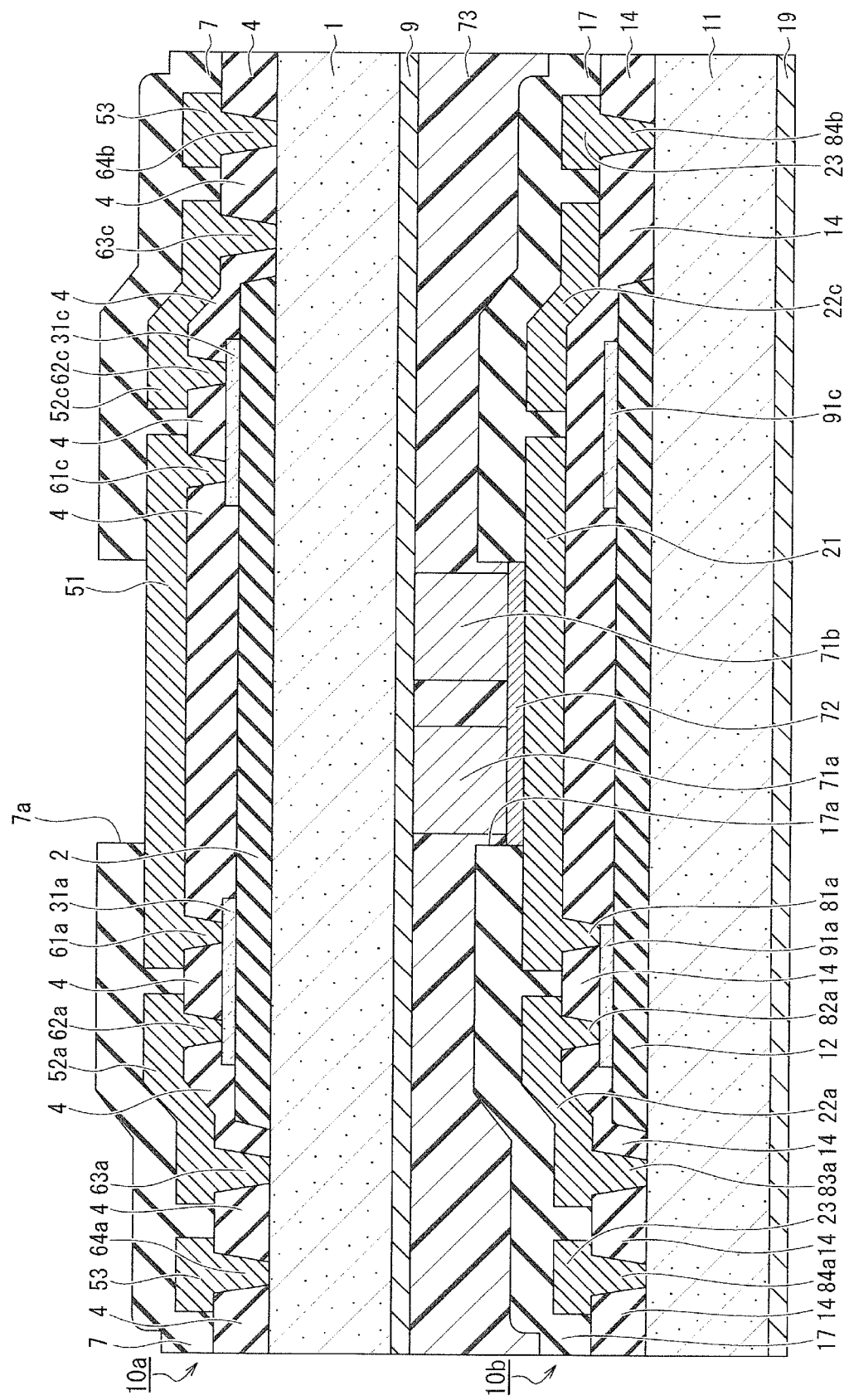
FIG. 29 is a cross-sectional view of a resistance element according to a fourteenth modification of the embodiment.

As shown in FIG. 29, a resistance element according to a fourteenth modification of the embodiment of the present invention differs from other embodiments in that the upper resistance chip 10a of the resistance element according to the embodiment shown in FIG. 2 and the lower resistance chip 10b of the resistance element according to the first modification example shown in FIG. 12 are stacked together. Thus, the upper resistance chip 10a and the lower resistance chip 10b have the same chip size (the same planar outer shape), but have different structures and have different resistance values. Since the other configurations of the resistance element according to the 14th modification are the same as those of the resistance element according to the embodiment, duplicated descriptions will be omitted.

According to the resistance element of the fourteenth modification, the degree of freedom of the resistance value can be improved by stacking the upper resistance chip 10a and the lower resistance chip 10b having different resistance values. It is also possible to stack the upper resistance chip 10a of any of the embodiment and its first and thirteenth modifications and the lower resistance chip 10b of any of the embodiment and its first and thirteenth modifications to construct a resistor. Further, in the resistance element according to the embodiment of the present invention and the first to thirteenth modifications, the number of resistance layers used by the upper resistance chip 10a and the lower resistance chip 10b may be different from each other to have different resistance values.

OTHER EMBODIMENTS

As mentioned above, the invention has been described by embodiments and their modification examples, but these statements and drawings that form part of this disclosure should not be understood to limit the invention. This disclosure will reveal to those skilled in the art various alternative embodiments, examples and operational techniques.

For example, as shown in FIG. 6, the case where the resistance element according to the embodiments is applied as the gate resistances R1 to R12 is illustrated, but the application is not limited to the gate resistance R1 to R12. The resistance element according to any of the embodiments can be applied as a resistance element of various ICs.

Further, in the resistance element of the above-described embodiments, the case where two stage—upper resistance chips 10a and the lower stage resistance chips 10b—are stacked is exemplified, but three (three stages) or more resistance chips may be stacked. In this case of the three or more stacked resistance chips, the electrical path between the pad forming electrode of the uppermost resistance chip and the back surface electrode of the lowermost resistance chip is used as a resistor. Higher resistance values can be achieved by increasing the number of stacked resistance chips.

Further, in the resistance element according to the above-described embodiments, the case where each of the upper resistance chip 10a and the lower resistance chip 10b has a plurality of resistance layers is exemplified, but one or both of the upper resistance chip 10a and the lower resistance chip 10b may have only one resistance layer.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A resistance element, comprising:
a plurality of resistance chips stacked vertically, each of the plurality of resistance chips including:
a semiconductor substrate,
a field insulating film on the semiconductor substrate,
one or more resistance layers on the field insulating film, an interlayer insulating film covering the field insulating film and the one or more resistance layers, a pad forming electrode on the interlayer insulating film and electrically connected to one end of at least one of the one or more resistance layers, a relay wiring on the interlayer insulating film, laterally separated from the pad forming electrode, one end of the relay wiring being electrically connected to one end of at least one of the one or more resistance layers other than said one end of at least one of the one or more resistance layers to which the pad forming electrode is electrically connected, another end of the relay wiring making ohmic contact with the semiconductor substrate, and a back surface electrode at a bottom of the semiconductor substrate, making ohmic contact with the semiconductor substrate, wherein the plurality of resistance chips have the same planar outer shape, and are stacked one over another such that the back surface electrode of the resistance chip stacked on top of another resistance chip is electrically connected to the pad forming electrode of the another resistance chip immediately therebelow so that a current path between the pad forming electrode on an uppermost resistance chip and the back surface electrode of a lowermost resistance chip constitutes a resistor.

2. The resistance element according to claim 1, wherein said another resistance chip immediately therebelow further includes a plating layer on the pad forming electrode, and wherein the back surface electrode of the resistance chip stacked on top is bonded to the plating layer of the another resistance chip immediately therebelow via a bonding layer.

3. The resistance element according to claim 2, wherein the bonding layer is provided in a plurality at a plurality of locations separated from each other.

4. The resistance element according to claim 2, wherein the bonding layer is provided at a center of the planar pattern of the resistance chips.

5. The resistance element according to claim 2, wherein the bonding layer is in contact with an insulating layer provided between the back surface electrode of the resistance chip on top and the plating layer of the another resistance chip immediately therebelow.

6. The resistance element according to claim 1, wherein the plurality of resistance chips have the same structure as each other.

7. The resistance element according to claim 1, wherein the plurality of resistance chips have different resistance values from each other.

8. The resistance element according to claim 1, wherein each of the plurality of resistance chips further includes a protective insulating film on the pad forming electrode, the relay wiring, and the interlayer insulating film.

9. A method for manufacturing a resistance element, comprising:

preparing a plurality of resistance chips, each of the plurality of resistance chips having the same planar outer shape and including:

a semiconductor substrate, a field insulating film on the semiconductor substrate, one or more resistance layers on the field insulating film, an interlayer insulating film covering the field insulating film and the one or more resistance layers, a pad forming electrode on the interlayer insulating film and electrically connected to one end of at least one of the one or more resistance layers, a relay wiring on the interlayer insulating film, laterally separated from the pad forming electrode, one end of the relay wiring being electrically connected to one end of at least one of the one or more resistance layers other than said one end of at least one of the one or more resistance layers to which the pad forming electrode is electrically connected, another end of the relay wiring making ohmic contact with the semiconductor substrate, and a back surface electrode at a bottom of the semiconductor substrate, making ohmic contact with the semiconductor substrate; and stacking the plurality of resistance elements vertically such that the back surface electrode of the resistance chip stacked on top of another resistance chip is electrically connected to the pad forming electrode of the another resistance chip immediately therebelow so that a current path between the pad forming electrode on an uppermost resistance chip and the back surface electrode of a lowermost resistance chip constitutes a resistor.

10. The method according to claim 9, wherein the stacking of the plurality of resistance elements vertically includes forming a plating layer on the pad forming electrode of the another resistance chip immediately therebelow, and bonding the back surface electrode of the resistance chip stacked on top to the plating layer of the another resistance chip immediately therebelow via a bonding layer.

11. The method according to claim 10, wherein each of the plurality of resistance chips further includes a protective insulating film on the pad forming electrode, the relay wiring, and the interlayer insulating film, and wherein the method further comprises filling a space between the back surface electrode of the resistance chip stacked on top and the plating layer and the protective insulating film of the another resistance chip immediately therebelow with a sealing material.

\* \* \* \* \*